(12) United States Patent
Warburton et al.

(10) Patent No.: US 7,966,155 B2
(45) Date of Patent: Jun. 21, 2011

(54) METHOD AND APPARATUS FOR IMPROVING DETECTION LIMITS IN X-RAY AND NUCLEAR SPECTROSCOPY SYSTEMS

(75) Inventors: William K. Warburton, Menlo Park, CA (US); Jackson T. Harris, Berkeley, CA (US); Peter M. Grudberg, Oakland, CA (US); Gregory Roach, Como West (AU)

(73) Assignee: William K. Warburton, Hayward, CA (US)

( * ) Notice: Subject to any disclaimer, the term of this patent is extended or adjusted under 35 U.S.C. 154(b) by 0 days.

(21) Appl. No.: 11/142,819

(22) Filed: May 31, 2005

(65) Prior Publication Data

US 2006/0015290 A1    Jan. 19, 2006

Related U.S. Application Data

(60) Provisional application No. 60/577,389, filed on Jun. 4, 2004.

(51) Int. Cl.
  *G06F 10/00* (2006.01)
(52) U.S. Cl. .................................................. 702/190
(58) Field of Classification Search .................. 702/190, 702/17, 69, 70, 106, 124; 708/300
  See application file for complete search history.

(56) References Cited

U.S. PATENT DOCUMENTS

| | | | |
|---|---|---|---|
| 3,872,287 A | 3/1975 | Koeman | |
| 5,184,017 A * | 2/1993 | Tury et al. ..................... | 250/343 |
| 5,349,193 A | 9/1994 | Mott et al. | |
| 5,684,850 A | 11/1997 | Warburton et al. | |
| 5,870,051 A | 2/1999 | Warburton et al. | |
| 5,873,054 A | 2/1999 | Warburton et al. | |
| 6,587,814 B1 | 7/2003 | Warburton et al. | |
| 6,609,075 B1 | 8/2003 | Warburton et al. | |
| 2002/0001365 A1 * | 1/2002 | Mazor et al. ..................... | 378/89 |
| 2004/0158440 A1 * | 8/2004 | Warburton et al. ........... | 702/190 |

OTHER PUBLICATIONS

Audet et al., "High Resolution Energy Dispersive Spectroscopy with High Purity Germanium Detectors and Digital Pulse Processing," *1994 IEEE Conf. Record*, 1:155-159 (1994).

(Continued)

*Primary Examiner* — Tung S Lau
(74) *Attorney, Agent, or Firm* — Kilpatrick Townsend & Stockton LLP

(57) ABSTRACT

A spectrometry method and apparatus for filtering step-like pulses output by a preamplifier to measure the energy or other desired characteristics of events occurring in a detector attached to the preamplifier. The spectrometer provides a set of filters that are capable of measuring the desired characteristic with different accuracy or resolution, detects the pulses in the preamplifier signal, and measures the time between consecutive pairs of detected pulses. For each detected pulse, the spectrometer selects a filter from the set of available filters, based on the measured time intervals between the pulse and its immediately preceding and succeeding detected pulses, applies it to the pulse, and indexes the output of the filtering operation with one or more indices identifying the selected filter.

46 Claims, 9 Drawing Sheets

OTHER PUBLICATIONS

Knoll, eds., pp. 605-625 from *Radiation Detection and Measurement, 2nd Edition*, published by J. Wiley, New York (1989).

Koeman, H., "Principle of operation and properties of a transversal digital filter," *Nuc. Instr. Methods.* 123:169-180 (1975).

Lakatos, T., "Adaptive Digital Signal Processing for X-ray Spectrometry," *Nuc. Instr. Methods Phys. Res.*, B47:307-310 (1990).

Skulski et al., "Particle identification in Cs1(T1) using digital pulse shape analysis," *Nuc. Instr. Methods Phys. Res.*, A458:759-771 (2001) with attached Product Application Notes by Xia, "Particle Identification by REal Time Pulse Shape Analysis in Cs1(t1), Phoswiches, and other Scintillators".

* cited by examiner

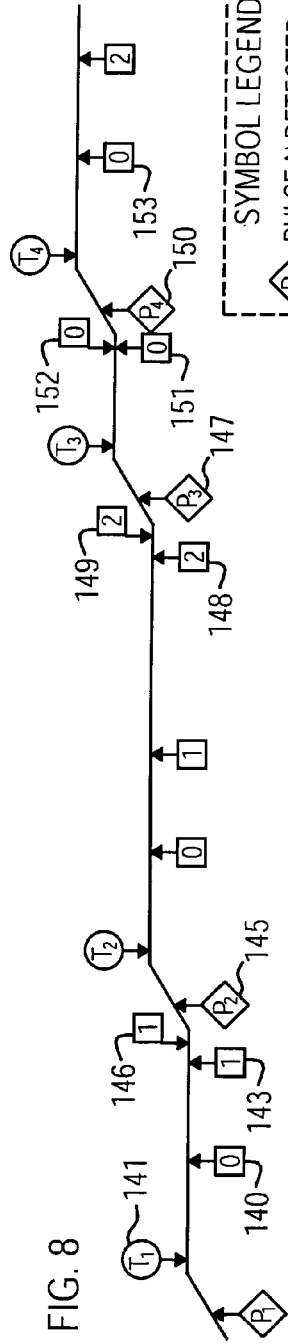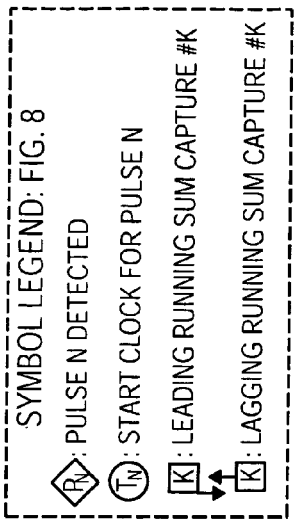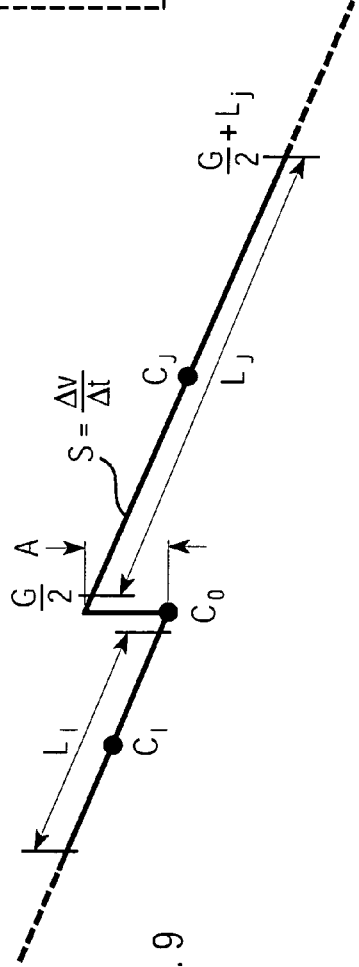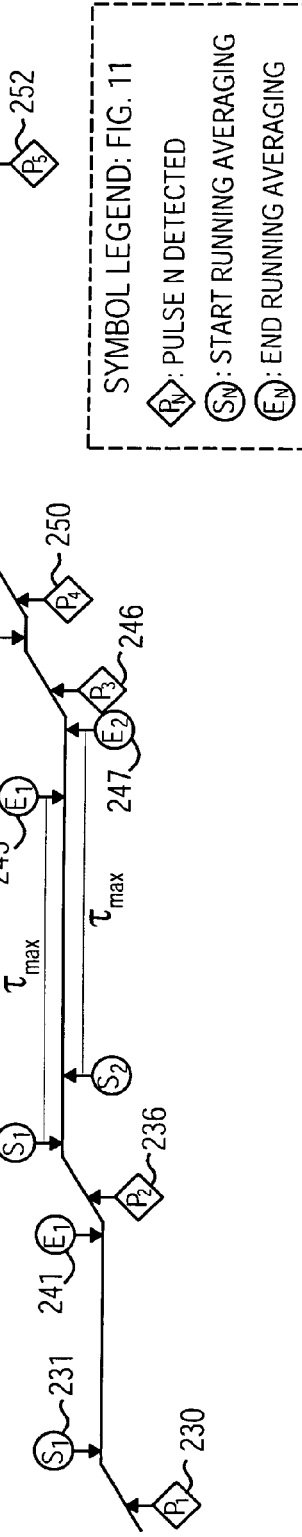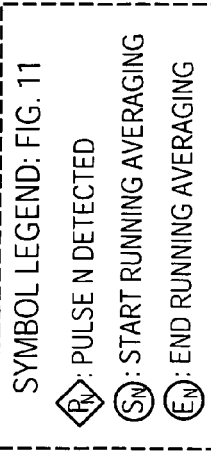
FIG. 8
FIG. 9
FIG. 11

METHOD AND APPARATUS FOR IMPROVING DETECTION LIMITS IN X-RAY AND NUCLEAR SPECTROSCOPY SYSTEMS

CROSS-REFERENCE TO RELATED APPLICATION

This application claims priority to U.S. Provisional Patent Application No. 60/577,389, filed Jun. 4, 2004, for Method and Apparatus for Improving Detection Limits in X-Ray and Nuclear Spectrometry Systems (naming as inventors William K. Warburton et al.), the entire disclosure of which is incorporated by reference for all purposes.

BACKGROUND OF THE INVENTION

The present invention relates generally to systems for detecting, counting and measuring the amplitude of step-like signal events such as those produced by preamplifiers attached to radiation detectors used to detect x-rays, gamma-rays, nuclear particles, and the like. More particularly, it relates to increasing the accuracy with which the amplitudes of these step-like events are measured by applying time variant filtering, indexing determined amplitudes according to the parameters of the applied filter, and using the index values to sort the measured amplitudes into a set of spectra on an event-by-event basis. By appropriately processing signals between the events, baseline corrections can also be employed.

The specific embodiments described relate to processing step-like signals generated by detector systems in response to absorbed radiation or particles and, more particularly, to digitally processing such step-like signals in high resolution, high rate x-ray spectrometers with reset feedback preamplifiers. The method can also be applied to gas proportional counters, scintillation detectors, and gamma-ray (γ-ray) spectrometers with resistive feedback preamplifiers, and, more generally, to any signals that have the described characteristics. The application associated with the described specific embodiment, namely the detection of dilute elements in ore bodies, is given particular attention only because this was the area in which the method was first developed.

The techniques that we have developed should therefore should not be construed as being limited to this specific application. Any detection system, for example, that produces output current pulses that are integrated by charge sensitive preamplifiers could be treated by these techniques, whether the detected quantities are light pulses, x-rays, nuclear particles, chemical reactions, or otherwise. Other detection systems that produce output signals that are electrically equivalent can be similarly processed: for example the current output of a photomultiplier tube attached to a scintillator produces a signal of this type.

A Synopsis of Current Spectrometer Art

FIG. 1 shows a schematic diagram of a prior art radiation spectroscopy system employed with a solid state detector diode 7. Similar systems are used for measuring x-ray, gamma-ray and alpha and beta particle radiations, differing primarily in the physical form of the detector diode 7, which might also be replaced with a proportional counter or other detector. All of these detectors 7 share the common property that, when biased by a voltage supply 8, they produce an output current pulse when detecting an absorption event and the total charge $Q_E$ in this pulse is approximately proportional to the energy E of the absorbed ray or particle. This current flows into a preamplifier 10, where it is integrated onto feedback capacitor 13 by amplifier 12, whose output is then a step of amplitude $A_e = Q_E/C_f$, where $C_f$ is the capacitance of feedback capacitor 13.

A spectroscopy amplifier 15 is then used to measure $A_E$. Within modern spectroscopy amplifiers 15 the output of preamplifier 10 is typically sent to both a "slow" energy filter circuit 17 and a "fast" pileup inspection circuit 18. The energy filter circuit filters the $A_e$ step to produce a low noise, shaped output pulse whose peak height is proportional to $A_E$. The pileup inspection circuit applies a fast filter and discriminator to the preamplifier output to detect $A_e$ signal steps (events) and signals the filter peak capture circuit 20 to capture amplitudes from those shaped pulses produced by the energy filter circuit 17 which have sufficient time separation so that they do not distort each other's amplitudes (i.e., do not "pile up"). The distinction between the "fast and "slow" filters is relative, based on the particular application, but the "fast" filter's time constant is typically at least 10 times shorter than the "slow" energy filter's (e.g., a 200 ns fast filter and a 4 µs energy filter in a typical x-ray spectrometer). The inspection circuit 18 also determines when events are sufficiently separated so that the output of the energy filter circuit has returned to its DC (i.e., non-zero offset) value and signals the baseline capture circuit 22 to capture these values so that they may be subtracted from captured peak values by the subtraction circuit 23. These differences are then passed to a multichannel analyzer (MCA) or digital signal processor (DSP) 25, for binning to form a spectral representation (spectrum) of the energy values present in the incident radiation.

The art of building spectroscopy amplifiers is relatively mature and many variations, using both analog and digital electronics, exist on the basic circuit shown in FIG. 1. The reference book by Knoll provides a good introduction to the subject [KNOLL—1989]. Further discussion may be found in U.S. Pat. Nos. 5,684,850, 5,870,051, 5,873,054 and 6,609,075B1 by Warburton et al. [WARBURTON—1997, 1999A, 1999B, and 2003]. For example, in some designs the filter peak capture circuit senses and captures peaks autonomously and the job of the pileup inspector is to discriminate between valid and invalid capture and only allow valid values to pass on to the subtraction circuit 23. Moreover, the order of the shown components may be altered to achieve the same ends. Thus, in analog circuits the baseline capture circuit is commonly a switched capacitor which is tied to the output of the energy filter circuit 17 as long as the baseline is valid and disconnected whenever the pileup inspection circuit detects a event. The time constant of this circuit is long enough to filter baseline noise. The subtraction circuit 23 is then typically an operational amplifier with the capacitor voltage applied to its negative input and the peak capture circuit 20 applied to its positive input. In some cases, even the order of circuits 20 and 23 is reversed, so the offset is removed from the energy filter circuit's output before peak amplitudes are captured. In traditional MCA's, in fact, the peak capture capability is included in the MCA 25 and removed entirely from spectroscopy amplifier 15. Digital spectrometers are slightly different in that they capture only single baseline values, which have the same noise as the signal. In this case the baseline values are typically averaged to reduce their noise and the average <b> is then presented to subtraction circuit 23. The net result is the same, however, and the basic functions presented in FIG. 1 capture the essence of the operation of these spectrometers as a class.

Pileup Inspection and the Count Rate/Energy Resolution Tradeoff

As noted above, event amplitudes are found by filtering (or "shaping") the preamplifier signal. In the simplest case, a digital trapezoidal filter, this just means forming averages of the preamplifier signal after and before the event and taking the difference of the two. The error in the measurement is then the sum of the errors in the two averages, added in quadrature. To the extent that the noise has a white power spectrum (i.e., series noise) the errors in the averages can be reduced by increasing the averaging time. This is the common regime for high count rate operation, where extending the averaging time (i.e., peaking time) improves energy resolution. If, however, another event arrives during the averaging time, then the measurement is spoiled (for both events) and they are said to have "piled up" because the output signal from the energy filter is the sum of the shaped pulses from the two events piled on top of each other. While other digital or analog shaping amplifiers may employ more complex filters, the same basic constraint applies: using a longer peaking (shaping) time improves energy resolution but increases pileup, while using a shorter peaking time increases throughput but degrades energy resolution. Hence, with state-of-the-art spectrometers, selecting a peaking time at which to operate is therefore always a compromise that allows an adequate number of counts to be collected into the spectrum at an acceptable resolution.

The number of counts that do not pile up is readily determined, assuming paralyzing dead times and random event arrival times, from Poisson statistics, which gives the familiar throughput formula relating output counting rate (OCR) to input counting rate (ICR):

$$OCR=ICR \exp(-ICR^*\tau_d). \quad (1)$$

Here the deadtime $\tau_d$ is related to the signal averaging time and, in good spectrometers is approximately the base width of the shaped pulse. In a modern digital spectrometer with trapezoidal filtering, the deadtime is 2*(peaking time $\tau_p$+flattop time $\tau_g$) [WARBURTON—2003]. The maximum in Eqn. 1 is $OCR_{max}=\exp(-1)/\tau_d$, at $ICR_{max}=1/\tau_d$, showing that the $\tau_p$ (and hence $\tau_d$) that optimizes throughput depends upon ICR.

While, from Eqn. 1, reducing $\tau_d$ always increases throughput, the required $\tau_p$ reduction also degrades energy resolution, which may be unacceptable in a real life application. For example, FIG. 2A shows a weak spectral line sitting on a significant background counting rate. Many important detection problems are of this class, including quantifying dilute element concentrations in complex substances, detecting small amounts of radioactive material against a natural background, or measuring a weak fluorescence process in the presence of stronger elastic scattering. Typically the counts in peak $P_2$ is found by summing the counts in the $P_2$ region and then subtracting a background estimated from measurements in the regions $B_1$ and $B_2$. Because peaks seldom occur in isolation, realistic situations more commonly resemble the figures FIG. 2B or FIG. 2C, where the region for making the background measurement becomes constrained by the difference between the inter-peak separations and the spectrometer's resolution. Clearly, for example, if the energy resolution were improved by a factor of 2 in FIG. 2B and FIG. 2C, then, relatively speaking, FIG. 2B would resemble FIG. 2A and FIG. 2C would resemble FIG. 2B in terms of the relative number of channels available to make peak and background measurements. Indeed, from the point of view of detection limit, the smaller the value of the spectrometer's energy resolution $\Delta E$, the better, since the number of counts from the spectral line $S_2$ contributing to $P_2$ will remain constant as $\Delta E$ decreases, but the number of background counts will decrease in proportion to $\Delta E$. Hence both the fractional error due to background decreases and the accuracy with which it is known increases as the regions $B_1$ and $B_2$ increase. From this point of view, therefore, the peaking time $\tau_p$ should be made as long as possible in order to decrease $\Delta E$. This leads to a fundamental dilemma, since beyond a certain point the loss of counts due to pileup will negate any further gains due to improved resolution.

Time Variant Filtering Methods

Time variant filtering attempts to optimize this tradeoff by adjusting the signal averaging time on an event-by-event basis. FIG. 3 shows the situation, with a preamplifier trace 40 having 7 events. Filtered using a 1 μs trapezoidal filter 42, five of the events are filtered correctly and two (numbers 5 & 6) pileup. Filtered with a 2 μs trapezoidal filter 43, only two of the events are filtered correctly (numbers 3 & 4) and the rest pile up. However, in the time variant approach, first devised by Koeman and later developed and commercialized by others [KOEMAN—1975, LAKATOS—1990, AUDET—1994, and MOTT—1994], the entire interval between each pair of events is used for the signal averaging process. In some cases a simple running sum average is employed, but more typically the full set of points is recorded into the memory of a digital signal processor and filter function weights are applied, the particular set of weights being selected depending upon the length of the interval. These intervals are represented in FIG. 3 as horizontal lines 47 that exclude the region of the event risetimes. We notice that, if simple running averages were used, as an extension of the symmetrical trapezoidal filtering case, each event is processed by an asymmetrical trapezoid whose risetime is the time to the preceding event and whose falltime is the time to the following event as suggested by the dotted traces 48 below curve.

Time variant filtering has recognized advantages and disadvantages. The main advantage is that it is efficient: all events separated by some minimum allowed measurement time are processed and as much information is used as is available. Hence, for a given counting rate, the time variant processor not only achieves a higher throughput but also a better energy resolution. The method has, however, three important disadvantages. First, its spectral response function is non-Gaussian, being built up of many Gaussians with different resolutions corresponding to the range of variable shaping times used in processing the events. This, per se, is not bad. The second problem is that the shape of the response function varies with ICR, since the number of events being processed with longer and shorter processing times varies with rate. This fact disqualifies the method for use in the majority of analysis methods, which are based on the use of standard material measurements. Because there is no way to guarantee that the standards and unknowns can be collected at identical ICRs, the peak shapes cannot be accurately compared between the two and the analysis methods fail. Finally, because these time variant filters use all the available data to process the events, there is no data left over for making baseline measurements, which degrades resolution and makes it unpredictable as well. It would therefore be desirable, particularly in situations where the goal is to measure weak lines against large backgrounds, to have an event processing method that improved throughput and resolution without the penalty of having a poorly defined or undefined response function. It would be further useful to be able to make baseline measurements to stabilize the response function at high counting rates and against other sorts of variations.

SUMMARY OF THE INVENTION

The present invention provides techniques (including method and apparatus) for filtering step-like pulses in the output of a preamplifier to determine one or more characteristics of events occurring in a detector attached to the preamplifier in a manner that works to maximize the amount of information obtained about each pulse and so reduce the number of pulses that need to be processed to reach a specific level of measurement accuracy. While the invention was developed in the context of radiation spectroscopy, the same methods can be applied to any situation involving the filtering of randomly arriving step-like pulse signals.

In brief, the approach entails providing a spectrometer with the means to detect the presence of step-like pulses in the preamplifier signal, means for measuring the time between consecutive pairs of detected pulses, and a set of filters that are capable of filtering step-like pulses to obtain estimates of one or more characteristics of the pulses. The spectrometer then applies a filter to each detected pulse, the applied filter being selected from the set of available filters based on the measured time intervals between the pulse and its immediately preceding and succeeding detected pulse, and indexes the output of the applied filter with one or more indices that identify the applied filter. The indexed filter outputs can then be sorted into a plurality of categories, each output being assigned to a particular category or categories based upon the value of its indices.

In the context of radiation spectroscopy, the amplitudes of the step-like pulses are typically the characteristic of interest, since they are proportional to the energies of the radiation absorption events within the detector. In this case the set of filters would be shaping filters, characterized by their shaping or rise times, that would produce estimates of the pulses' amplitudes and so of the event energies, and these estimates would be indexed by indices identifying the filters' shaping times. Because the energy resolution of shaping filters is related to their shaping times, using shaping times to sort the filters' outputs into categories or "spectra" produces a set of spectra where each spectrum has its own characteristic energy resolution. Thus all the information produced by the filters is maintained, in contrast to the prior art where, if the spectrometer had multiple or adaptive filters, all their outputs were placed into a single spectrum and information was lost as outputs from filters with better energy resolution were commingled with outputs from filters with poorer resolution.

Because it is possible to implement many different filters to be members of the set of filters, we also introduce the concept of a "quality factor" to quantify the performance of a set of filters and allow the efficiency of different sets of filters to be compared. Our preferred quality factor is the inverse of the time required to detect a peak above background at a specified signal-to-noise ratio. With this definition, an optimum set of filters can be selected for a particular measurement by finding the set with the maximum quality factor. We describe two methods for determining this optimum set: one when the filters' peaking times are related to one another by a mathematical relationship and one when they are not.

While the pulses' amplitudes are a common characteristic of interest, there are others, including their area, and, if they are pulses that decay with time, the time constants describing their decay, which may vary on a pulse by pulse basis. Step-like pulses are also generated in other physical processes than absorption events in detectors, and the method can be used beneficially in analyzing them as well. For example, the method can be used to determine the amplitudes of pulses from solid state or gaseous photon detectors, the areas or decay times of pulses from scintillators absorbing gamma-rays or energetic particles, or the amplitudes or areas of pulses produced by superconducting bolometers absorbing photons or neutrons.

The output of the applied filter can also be baseline corrected to account for either residual slope or DC offset value in the preamplifier's signal by subtracting from it a baseline value representing that fraction of the filter's output that would be present if the filter were applied to a nearby portion of the signal wherein no step-like pulse was present. The baseline value can be estimated by measuring the baseline value of a second, "baseline" filter at times when no step-like pulse is present and then scaling the measured value to account for differences between the parameters of the applied and baseline filters. The accuracy of this approach can be increased by applying the scaling operation to an average of multiple baseline filter measurements.

The specification presents three implementations to demonstrate the method, the implementations ranging from simple to complex. While these implementations are most easily constructed using digital signal processing techniques, that is not a requirement of the method.

In the first implementation, the spectrometer has 4 energy filters that process pulses to determine the energy of the generating detector event, the filters being characterized by their peaking times. The spectrometer also has a fast pulse detection circuit and a pileup inspection circuit to measure the times between pairs of detected pulses. For each detected pulse the circuit measures the intervals between the pulse and its preceding and succeeding pulses and then filters the pulse with the filter having the longest peaking time that is shorter than both of the preceding and succeeding time intervals. In the specific implementation this selection criterion is carried out by having the four filters continuously processing the preamplifier signal and connecting them via a multiplexer to a peak capture circuit. Each time the fast pulse detection circuit detects a pulse, the pileup inspection circuit gates the multiplexer to capture the peak output from each filter in turn, starting with the shortest peaking time, until it reaches the point where the next filter to be connected to the multiplexer would violate the selection criterion. The captured peak amplitude is then indexed with the value j showing that it was captured from the filter with peaking time $\tau_j$, where j runs from 0 to 3 for the four filters. After indexing, the captured peak amplitude is then binned into the spectrum $S_j$ corresponding to its filter. While the peaking times in this implementation can be arbitrary, it is often beneficial to choose values forming the geometric sequence $\tau_j = \tau_0 K^j$, particularly with the value K=2. In this case the optimum set of filters may be found by computing quality factors for all values of $\tau_0$ for which $\tau_3$ does not exceed the largest allowed value and selecting the set the maximizes the quality factor. The filter output values may be baseline corrected by capturing baseline values b of one of the filters (e.g., the $\tau_0$ filter) at times when there are no pulses present and updating a running average <b> of these measurements. The value <b>, appropriately scaled to account for differences between $\tau_0$ and $\tau_j$ can then be subtracted from the outputs captured from the $\tau_j$ filter to baseline correct it.

In the second implementation, each filter is composed of two running sum sub-filters, one summing the signal over a time region $\tau_j$ before the detected pulse and the other summing the signal over a time region $\tau_k$ after the detected pulse. In the design presented, there are 4 available running sums, of lengths $\tau_j = 2^j \tau_0$, so that there are 16 possible filters available for processing a detected pulse, of which 10 have unique energy resolutions since the filter pair ($\tau_j$, $\tau_k$) has the same energy resolution as the filter pair ($\tau_k$, $\tau_j$). All four filters continuously process the preamplifier signal, with their output values being captured under the control of a pileup inspection and timing control circuit that works as follows. Each time a pulse is detected, the control circuit starts a clock. When the clock value reaches $\tau_0$, the output of the $\tau_0$ filter is captured and records the value 0 as an index; when it reaches $\tau_1$, the output of the $\tau_1$ filter is captured and 1 recorded as an index; and so forth until either $\tau_3$ is reached or another pulse is detected. These "lagging" sums are placed into the negative input register of a gated "Energy" Subtracter, each replacing the former. When the next pulse is detected, the timing control uses the lagging sum's recorded index to capture a second output of that filter, appropriately delayed to allow this operation, just before the arrival of the next pulse. This filter output value is stored in a "leading" sum capture register for transfer to the positive input of the Energy Subtracter. Thus, for each pulse, a leading and lagging sum are captured and their difference is used to estimate the amplitude of the pulse. Because sums with different $\tau$ values have different numbers of terms, however, they must be scaled before they can be subtracted. In this implementation, because the lengths $\tau$ have the form $\tau_j=2^j\tau_0$, the scaling occurs before the capturing step through the use of shift registers, the output of the $\tau_j$ filter being shifted left by (3−j) bits so that all outputs are scaled to match the $\tau_3$ filter. The timing control places the indices of the pulse's leading and lagging sums into an Index Register at the same time as it gates the Energy Subtracter to take their difference. Thus, in this implementation, selecting the applied filter takes place in two steps: selecting a leading filter to process the signal before the pulse, and selecting a lagging filter to process the signal after the pulse. The output of the applied filter is then the value produced by the Energy Subtracter, which is read by a digital signal processor (DSP) and then placed in one of 10 spectra, depending upon the values of its indices, which the DSP reads from the Index Register. The resolutions of these spectra can vary significantly. For example, for an 80 mm planar HPGe detector used for detecting heavy metals in mining ores, using a peaking time $\tau_0$ value of 0.575 μs, leads to spectral resolutions between 796 eV, for the ($\tau_0$, $\tau_0$) filter and 446 eV for the ($\tau_3$, $\tau_3$) filter. Moreover, a simple performance model shows that preserving the resolutions of the individual filters allows the counting time to achieve a specific signal to noise ratio for a weak spectral line to be reduced by 50%, compared to optimum processing using only a single filter.

This implementation is not difficult to baseline correct. If we measure the average slope s in the preamplifier signal by taking successive measurements of one of the sum filters (e.g., the $\tau_2$ filter) in regions of adequate length without a detected pulse, and subtracting them, we obtain a value $L_3^2 s/2$, where $L_3$ is the number of sample values in the $\tau_3$ filter, from which s is readily obtained. If the applied filter output consists of $\tau_j$ leading sum bit-shifted by (3−j) bits and $\tau_i$ lagging sum bit-shifted by (3−i) bits with a gap of G samples between them which excludes the pulse itself, then we need only subtract $2^{j-3}(L_3^2 s/2)$ for the leading sum, $2^{i-3}(L_3^2 s/2)$ for the lagging sum, and $L_3 G s$ for the gap region for full baseline correction. This may be readily carried out either in gate array logic or in the DSP. Making multiple measurements of $L_3^2 s/2$ and/or s and averaging them will improve the accuracy of the baseline correction. If the gap G is constrained to be a power of 2 of $\tau_0$ as well, so that we can write $G=2^{g-1}L_0$, then the gap baseline correction term simplifies to $2^{g-3}(L_3^2 s/2)$. This is particularly convenient when the correction is carried out in the gate array, since only a single correction term ($L_3^2 s/2$) has to be downloaded from the DSP each time a new baseline measurement is made and the DSP computes a new baseline average.

If the four filters' peaking times are simply related, then the optimum set may be found by the same method described above. If, however, there is no simple mathematical relationship between them, then an different optimization algorithm is required. In this case we express the filter set's quality factor in terms of the four peaking times (either analytically or computationally) and then apply a maximum value search routine of the type that are commonly available in standard commercial data analysis packages.

The third implementation is similar to the second implementation except that, instead of using a set of 4 fixed length running sum filters, we use an adaptive length running sum filter that averages all the signal values between each pair of detected pulses, provided that its length L in clock cycles is greater than some preset minimum $L_{min}$ and does not exceed a preset maximum $L_{max}$. The minimum length $L_{min}$ is imposed so that the energy resolution of the shortest applied filter, whose leading and lagging sums are both $L_{min}$, will be analytically useful. The maximum length $L_{max}$ is imposed because, in the presence of detector leakage current, energy resolution in this type of filter degrades when filter times longer than some particular value are employed. Therefore, when the circuit's timing control clock counter reaches the value $L_{max}$, the filter is converted from an adaptive length filter to a filter of fixed length $L_{max}$, whose leading and lagging values are captured similarly to the second implementation. If the interval between two detected pulses is less than or equal to $L_{max}$ then only a single value is captured from the filter when a pulse is detected and it serves as the lagging sum for the previous pulse and the leading sum for the detected pulse. In this case, captured values from the running sum filter are indexed with their capture length $L_j$, which varies between $L_{min}$ and $L_{max}$. The output of the applied filter is then indexed with the pair of L values ($L_{j-1}$, $L_j$) of its leading and lagging sum lengths.

Since a fully adaptive running sum filter may have $L_t = (L_{max}-L_{min}+1)$ of L values, where $L_t$ may be hundreds, it is usually not beneficial to create $L_t(L_t+1)/2$ separate and unique spectra. We therefore show a method for binning applied filter outputs into a smaller number, N, of spectra whose contributing filters differ by some acceptably small percentage of their average resolution. Filter outputs are binned into these spectra in a two step process. First, using a lookup table of dimension ($L_{max}-L_{min}+1$), both $L_{j-1}$ and $L_j$ are converted into new indices $J_1$ and $J_2$ with the range of 0 to m−1 for some integer m. Forming the address $mJ_2+J_1$, we can then use a second lookup table of dimension $m^2$ to find the identity of the spectrum to which the filter output should be binned. In this implementation we constructed a log-log contour map of energy resolution versus ($L_{j-1}$,$L_j$) with 16 energy contours and then divided it into an m by m grid, with m=32, to show how spectra with $L_t$ equal to 380 (or 72,390 unique values of ($L_{j-1}$,$L_j$) are mapped into 16 spectra each of which has no more than a 6% energy variation.

Since this implementation has so many possible filter lengths that are not simple multiples of each other, either baseline corrections have to computed in a DSP, using the expression $(L+G)(L+1)s/2$ for each running sum, or else we can compute them on the fly as the adaptive running sum is filtering the signal. We show how this can be implemented using a pair of resettable adders, the first being reset to the value $sG/2$ each time the running sum filter is restarted after a pulse is detected, the second being reset to zero. The first resettable adder is then configured to add the value of the signal slope s to its output once per clock cycle, while the second adder adds the output of the first adder to its output once per clock cycle, which we show to produce the desired correction term $(L+G)(L+1)s/2$ after the same number L clock cycles as the running sum filter has been operating.

Finally, we describe how the method may be extended to more general filtering schemes, including linear combinations of weighted or unweighted sample values and how baseline correction may be implemented in these cases, noting in particular that if an applied filter is a linear combination of sub-filters, then its baseline correction can be expressed as the same linear combination of sub-filter baseline corrections. We also examine how the method may be applied to step-like pulses where other characteristics of the pulse than its amplitude may be of interest. For example, in pulses from scintillator crystals, the pulse area is the best measure of particle energy and the light output's decay constants can be used in certain particle identification schemes. All of these characteristics can be obtained by appropriately designed filtering schemes and therefore may benefit from the application of our inventive method. In closing, we observe that step-like pulses are the expected response of a single pole or multipole device to an impulsive stimulation and hence are an extremely common signal type, indicating that our method may be expected to find applications far beyond the realm of photon and particle detectors in which it was originally conceived and developed.

A further understanding of the nature and advantages of the present invention may be realized by reference to the remaining portions of the specification and the drawings.

BRIEF DESCRIPTION OF THE DRAWINGS

FIG. 8 shows the averaging times selected by the spectrometer of FIG. 7A for filtering a randomly arriving set of events and making baseline measurements;

FIG. 9 is a sketch of the signal in the vicinity of a pulse that indicates the terms used in calculating the dependence of baseline on signal slope;

FIG. 11 shows the averaging times selected by the spectrometer of FIG. 10 for filtering a randomly arriving set of events;

DESCRIPTION OF SPECIFIC EMBODIMENTS

1. Introduction to Multi-Spectral Binning

1.1 A Spectrometer with Four Peaking Times

Figure 1:
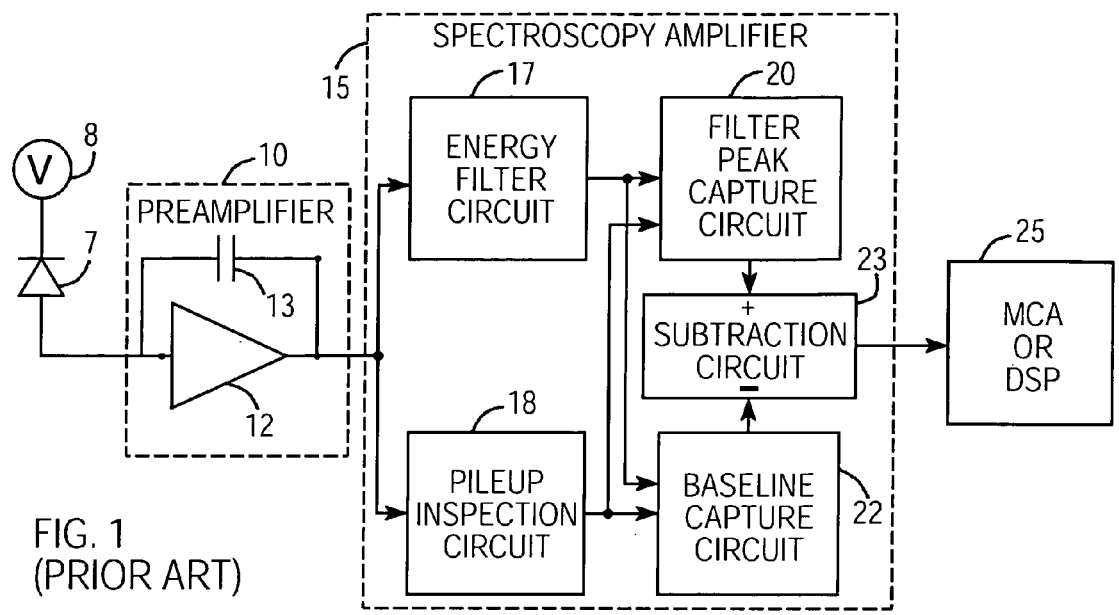
FIG. 1 shows a schematic of a generic prior art spectrometer.
Figure 4:
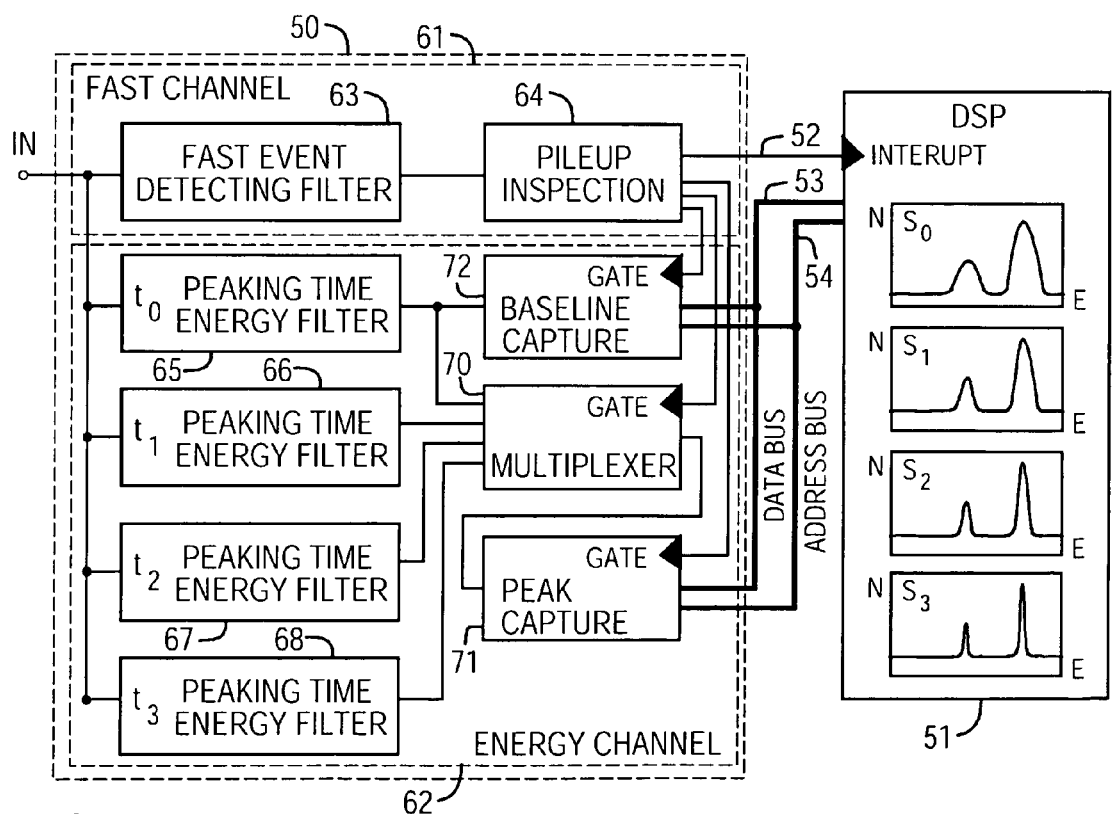
FIG. 4 shows a schematic of a simple time variant spectrometer capable of sorting processed events according to the energy filter used to process them and also making baseline measurements.

FIG. 4 shows a simple spectrometer embodying the inventive concept. It consists of two major blocks: a Spectrometer Body 50 corresponding to block 15 in FIG. 1 and a DSP block corresponding to block 25 in FIG. 1. Communication between the two blocks is handled by an Interrupt Line 52 and Data and Address Buses 53 and 54. The Spectrometer Body 50 comprising a Fast Channel 61 and an Energy Channel 62, wherein the Fast Channel comprises a Fast Event Detecting Filter 63 connected to a Pileup Inspection Circuit 64 while the Energy Channel comprises four Energy Filters 65, 66, 67, and 68; and a Gated Multiplexer 70 connecting the four Filters to a Gated Peak Capture circuit 71. A Gated Baseline Capture circuit 72 allows for baseline measurements to be made. The DSP 51 obtains values from the Gated Peak Capture 71 and Baseline Capture 72 circuits via Data Bus 53 and Address Bus 54. These circuits are all generic and can be implemented using either analog or digital techniques that are well known to those skilled in the art. For convenience of description, the energy filters are arranged so that their peaking times $t_0$-$t_3$ form an increasing sequence.

In operation, all the filters are connected to the preamplifier signal at the input. If the circuits are digital, the input signal will have already been digitized. The Fast Event Detecting circuit 63 detects events (signal steps) in the input signal so that the Pileup Inspection Circuit 64 may measure the time intervals between successive events, which it compares to the peaking times $t_0$-$t_3$ of the four Energy Filters with the goal of selecting the longest peaking time filter that can be used to filter each event without pileup.

The selection is accomplished as follows. For each detected event i, the Pileup Inspector 64 compares its preceding interval to the set of peaking times $t_0$-$t_3$ and saves the longest value $t_i$ that is less than the interval. If no value $t_i$ satisfies the criterion, the event is skipped for processing. When Pileup Inspection 64 detects the event i, it also starts a timer to measure the interval to event i+1 and connects the Multiplexer 70 to the to Energy Filter 65. If the timer reaches value $t_0$, then the Pileup Inspector triggers the gate on the Peak Capture 71 to capture the peak value of the shaped pulse output by the $t_0$ Energy Filter. After the capture is complete, it attaches the Multiplexer to the output of the $t_1$ Energy Filter 66 and begins comparing the timer to the value $t_1$ so that it can capture this Filter's peak if the interval exceeds $t_1$. This process is then repeated for times $t_2$ and $t_3$ unless it is stopped by the arrival of another event or the timer exceeds the stored value $t_i$ of the preceding interval. At the end of the process, the Peak Capture 71 holds the peak value output by the Energy Filter with the longest peaking time allowed by the intervals both before and after the event. It also fills a 2-bit index register showing which Energy Filter supplied the captured value.

In the preceding description we assumed symmetric pulse shaping, the extension to asymmetric pulse shaping is made in a straightforward manner by saving two sets of values $t_0$-$t_3$ for the risetimes and falltimes of the four filters and using them at the appropriate points in the tests.

Once the pulse amplitude is captured, the Pileup Inspector 64 signals the DSP 51 on Interrupt Line 52. The DSP then uses the Address Bus 54 and Data Bus 53 to read the captured value that represents the event's energy. It also reads the 2-bit index register and used this value as an address to bin the captured value into a spectrum specifically assigned to the associated Energy Filter. Thus the DSP builds four discrete spectra, with values captured from the $t_0$ Filter being placed in spectrum $S_0$, those from the $t_1$ being placed in spectrum $S_1$, and so forth. The four spectra are indicated schematically inside the DSP 51 in FIG. 4. Each spectrum preserves the energy resolution characteristic of its associated Filter's peaking time. The figure indicates this schematically, with the worst energy resolution in $S_0$, which is associated with the shortest peaking time $t_0$, and the best energy resolution in $S_3$, which is associated with the longest peaking time $t_3$.

This sorting process preserves as much information as the four Filters are capable of providing from the input data stream. If the inter-pulse intervals allow it to be processed using the longest peaking time Filter $t_3$, then this is done. If not, then the next shortest filter is tried and so on, so that the longest possible peaking time is always used. Then, by storing the data from each filter separately and not commingling them, the information is preserved.

Nothing in this circuit's operation requires any particular relationship between the peaking times of the set of filters or restricts the number of filters used. However, clearly, the amount of information that can be extracted from the input signal will depend upon the particular peaking times selected. The selection will also depend upon the expected counting rate. Using 1 µs filters when the average time between pulses is 10 µs is obviously not optimal, nor is attempting to apply 10 µs filters when the average interpulse time is 1 µs. On the other hand, if the circuit will see 1 Mcps on some days and only 100 Kcps on other days, then having both filter lengths available may be wise. The modeling results presented below suggest that using peaking times that form a geometric series (i.e., are of the form $\tau_j = \tau_0 K^j$) work well, particularly when K is the integer 2.

1.2 Addition of Baseline Sampling

Baseline sampling is readily added to the spectrometer of FIG. 4 by applying the method of Warburton et al. [WARBURTON—2003B] who showed how to employ measurements made using a filter of one peaking time $t_0$ make baseline corrections on measurements made using an energy filter of a different peaking time. In the present case we attach a Gated Baseline Capture register 72 to the output of the to Energy Filter and gate it from the Pileup Inspector to capture baseline measurements as taught by Warburton et al. The DSP 50 reads these captured values from time to time using Address Bus 54 and Data Bus 53 and updates a baseline average <b>. It then uses its current value of <b> to apply baseline corrections to the Energy Filter values captured from Peak Capture 71 prior to placing them in the spectra $S_0$-$S_3$.

2. Analysis of Benefits of Multi-Spectral Binning

In the preceding section we showed how to produce multiple spectra from multiple energy filters in such as way as to preserve each energy filter's inherent energy resolution. Before proceeding to describe embodiments that employ time variant filters whose risetimes and fall times may be different, it is valuable to examine the benefits that arise from this "multi-spectral" approach. In particular, we wish to demonstrate that the counting times required to achieve a particular detection limit are significantly reduced, particularly in the case of signals that are weak compared to background counting rates.

2.1 Quality Factors and the Time to Reach Signal-to-Noise Ratio K

Figure 2A:
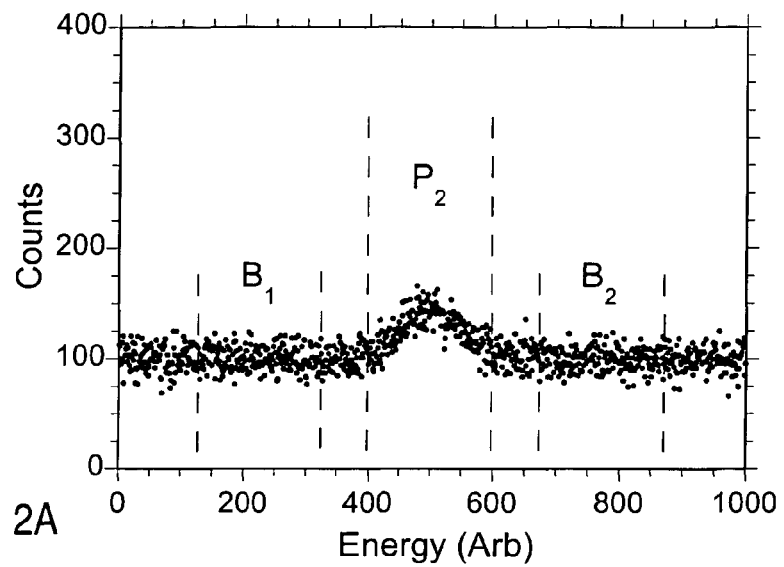
FIG. 2A shows a region of a spectrum that includes an isolated weak spectral line sitting on a relatively strong background.
Figure 2B:
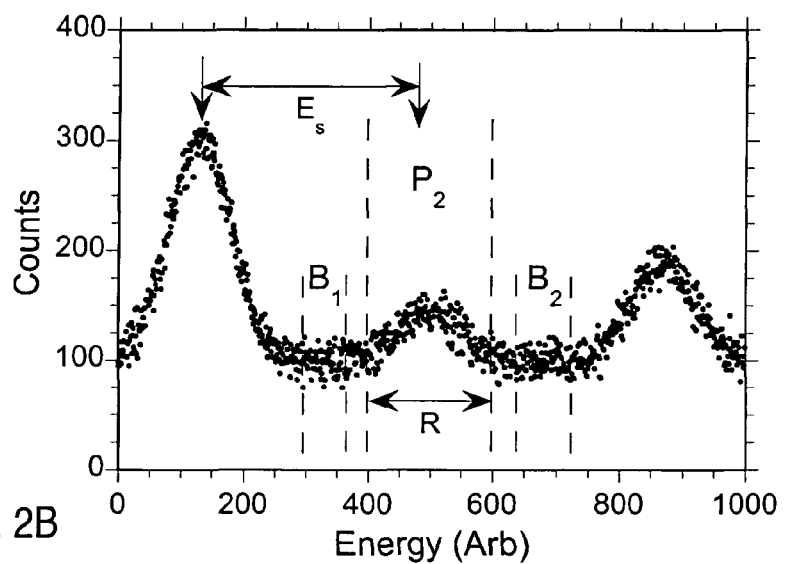
FIG. 2B shows a region of a spectrum that includes the weak spectral line of FIG. 2A, plus two neighboring but fully resolved spectral lines.

Certain assumptions are required to model the benefit of the inventive method, primarily because that benefit will vary with the experimental situation to which the method is applied. Therefore, for purposes of demonstration, we shall assume that we are attempting to measure a pulse similar to that shown in FIG. 2B, where the energy resolution at baseline is R and the local separation to the nearest spectral line is $E_S$. Because the background counting rate b and spectral intensity s of the line are independent of the energy resolution $R_{i,j}$ (at background) of the energy filter with risetime $\tau_i$ and falltime $\tau_j$, the expectation value $N_{Si,j}$ of counts from this line in spectrum $S_{i,j}$, including both the line and background, is:

$$N_{Si,j} \equiv (s + bR_{i,j}) OCR_{i,j} t \quad (2)$$

after counting time t, where $OCR_{i,j}$ is the output counting rate into $S_{i,j}$. "Expectation value" refers to the mean value we would measure, statistically, if we repeated the measurement a large number of times and is represented by the equality symbol ≡. The number of background counts into the region of interest (ROI) is proportional to $R_{i,j}$, which defines the ROI's energy width, while the number of spectral counts is independent of $R_{i,j}$. To determine s, we must subtract the background.

In each spectrum we measure the background using the ROI's $B_1$ and $B_2$. Approximating the sum of their widths as $2(E_S - R_{i,j})$, the expectation value $N_{bi,j}$ of a background count measurement in spectrum $S_{i,j}$ is:

$$N_{bi,j} \equiv 2b(E_s - R_{i,j}) OCR_{i,j} t. \quad (3)$$

The measured values $N_{bi,j}$ and $N_{bi,j}$ from the spectrum $S_{i,j}$ can then be combined to form an estimate $s_{i,j}$ of the value s according to:

$$s_{i,j} + \frac{N_{Si,j}}{OCR_{i,j} t} - \frac{N_{bi,j} R_{i,j}}{2(E_s - R_{i,j}) OCR_{i,j} t}, \quad (4)$$

whose variance $\sigma^2 s_{i,j}$ has the expectation value $$\sigma^2 s_{i,j} \equiv \frac{1}{t} \left\{ \frac{s + bR_{i,j}}{OCR_{i,j}} - \frac{bR_{i,j}^2}{2(E_s - R_{i,j}) OCR_{i,j}} \right\} \equiv \frac{\sigma^2 s'_{i,j}}{t}. \quad (5)$$

We now form the best estimate <s> of s, in the least squares sense, from the set of measurements $\{s_{i,j}\}$ over the set of spectra $\{S_{i,j}\}$ according to:

$$<s> = \frac{\sum_{i,j} \left( \frac{s_{i,j}}{\sigma^2 s_{i,j}} \right)}{\sum_{i,j} \left( \frac{1}{\sigma^2 s_{i,j}} \right)} = \frac{\sum_{i,j} \left( \frac{s_{i,j}}{\sigma^2 s_{i,j}} \right)}{W} \quad (6)$$

where W is the sum of the weights $1/\sigma^2 s_{i,j}$.

Figure 2C:
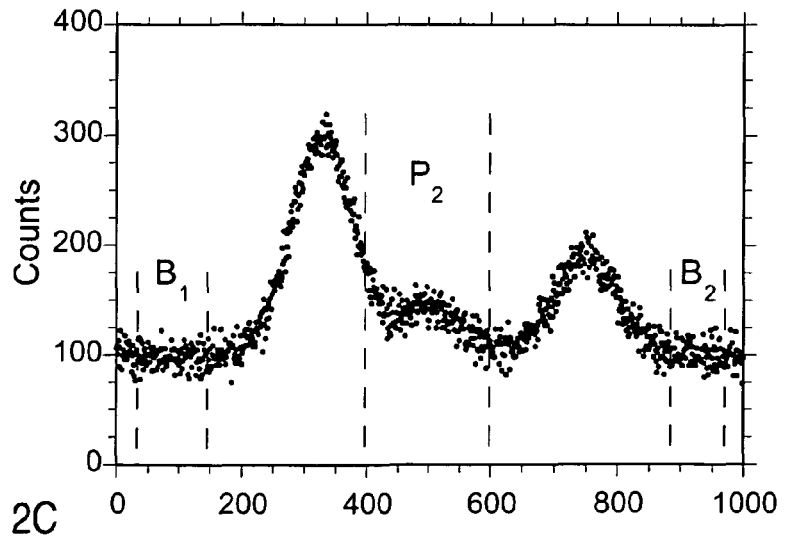
FIG. 2C repeats FIG. 2B but with the neighboring lines close enough so that they overlap the weak line of interest.
Figure 3:
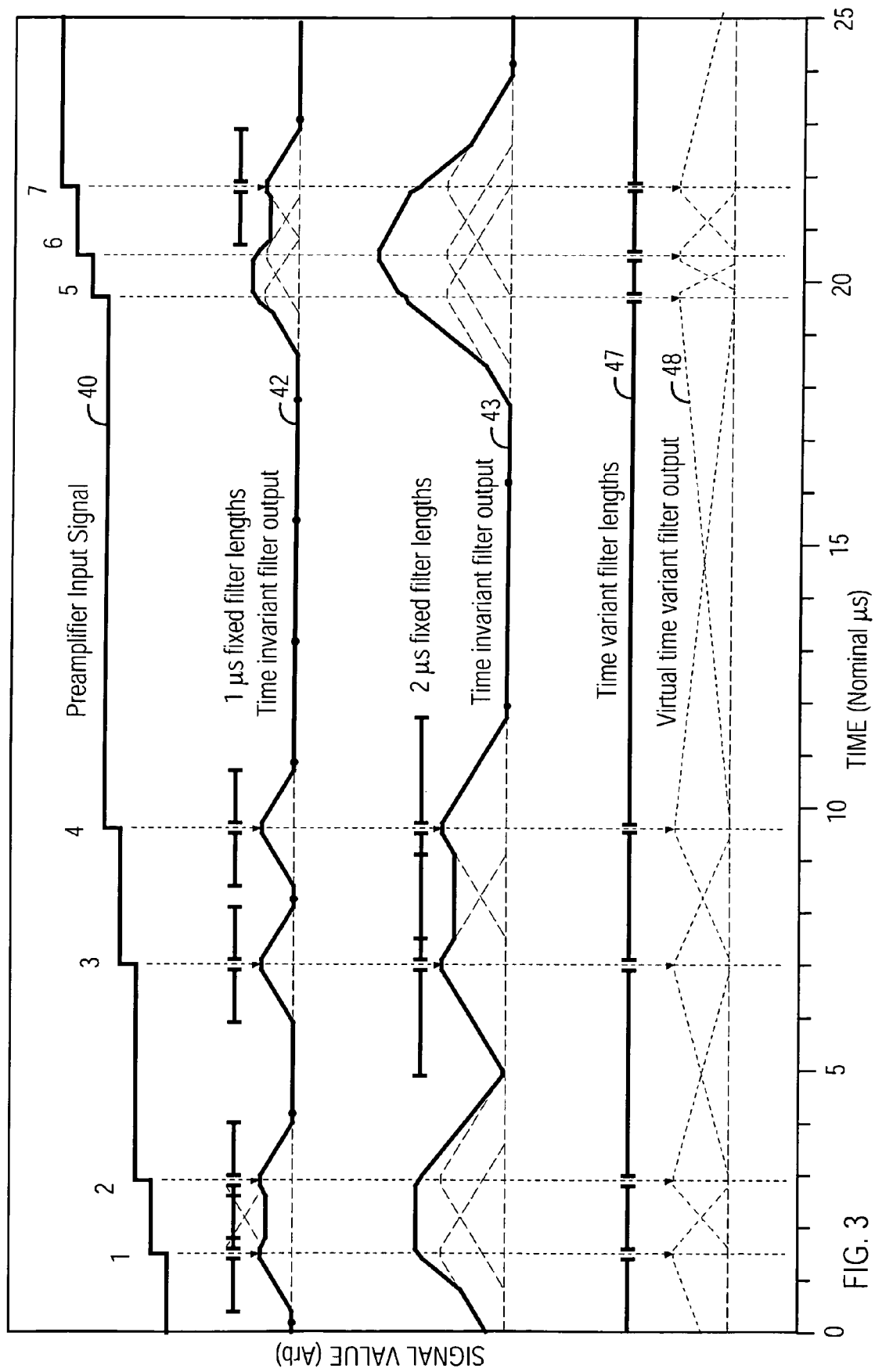
FIG. 3 shows a signal containing 7 events as it is output by the preamplifier and as processed by digital filters with 1 µs, 2 µs, and time variant processing times.

It is clear that other approaches may also be used to estimate $\langle s \rangle$ from the set of spectra $\{S_{i,j}\}$. For example, one might first create a least-squares best estimate $\langle b \rangle$ of the background from the measurements $N_{bi,j}$ in the spectrum set $\{S_{i,j}\}$ and then use $\langle b \rangle$ in Eqn. 2 to obtain the set of $\{s_i\}$ values. Or one might simultaneously fit the data from the full set of spectra $\{S_{i,j}\}$ to estimate both s and b, using the individual spectra's resolution functions as fitting functions. This approach, in particular, would allow using spectra $S_{i,j}$ whose resolution $R_{i,j}$ exceeded Es, per FIG. 2C, as might be encountered in regions of high spectral line density (e.g., x-ray 1-lines or nuclear emission lines) or applications to instruments with poor inherent energy resolution (e.g., proportional counters). While we contemplate using the multi-spectral data in all these ways, depending upon the experimental situation and its demands, for the present demonstration of the benefits of the inventive method, we restrict the discussion to the approach represented by Eqn. 6.

The goal of any particular measurement is assumed to be to measure $\langle s \rangle$ to a particular accuracy K, that is we desire a particular signal-to-noise ratio K, giving $$\frac{<s>^2}{\sigma^2 <s>} = K^2. \tag{7}$$

We therefore estimate $\sigma^2 \langle s \rangle$ according to the equation:

$$\sigma^2 <s> = \sum_{k,l} \left(\frac{\partial <s>}{\partial N_{Sk,l}}\right)^2 N_{Sk,l} + \sum_{k,l} \left(\frac{\partial <s>}{\partial N_{bk,l}}\right)^2 N_{bk,l}, \tag{8}$$

where $\langle s \rangle$ is found from Eqn. 6 using Eqns. 4 and 5.

If we then define a "Quality Factor" $Q = 1/t_K$, where $t_K$ is the time required to achieve the desired signal-to-noise ratio, we find after some manipulation that the expectation value of Q is given by:

$$Q \equiv \frac{s^2}{K^2} \sum_{k,l} \left(\frac{1}{\sigma^2 s'_{k,l}}\right) \tag{9}$$

$$\equiv \frac{s^2}{K^2} \sum_{k,l} \left(\frac{OCR_{k,l}}{\left(s + bR_{k,l} + \frac{bR_{k,l}^2}{2(E_s - R_{k,l})}\right)}\right) = \sum_{k,l} Q_{k,l}.$$

Hence the quality factors from the individual spectra add to produce the overall quality factor of the measurement. Hidden in this calculation is the intermediate result that the standard deviation of $\langle s \rangle$, namely $\sigma \langle s \rangle$ scales as sqrt(1/t), as expected. Eqn. 9, of course, also covers the case of the classic, single spectrum spectrometer when there is only a single term in the summation. The point to be emphasized regarding the concept of a quality factor is that it allows the statistical efficiency of different sets of filters to be compared, essentially by asking "How long will it take to collect good data with this filter set?" In particular, given information about the signal strength, background level, separation between spectral lines (given by $E_S$), x-ray flux, and detector characteristics (through the $R_{k,l}$ values) we can search for the optimum set of filters that minimizes our data collection time by comparing the quality factors of different sets.

In the small signal to background cases of present interest, s will be negligible compared to $bR_{k,l}$ and an individual quality factor becomes:

$$Q_{k,l} = \frac{s^2}{bK^2 R_{k,l}} \frac{OCR_{k,l}}{\left(1 + \frac{R_{k,l}}{2(E_s - R_{k,l})}\right)}. \tag{10}$$

The $Q_{k,l}$ are thus seen to scale in proportion to their output counting rates $OCR_{k,l}$ and the signal strength s squared. They scale in inverse proportion to the background b, to the desired signal-to-noise value K squared, and to the spectral resolution $R_{k,l}$. The effect of having a limited region $E_S$ in which to measure the background b is contained in the term $R_{k,l}/2(E_S - R_{k,l})$, which causes $Q_{k,l}$ to go to zero as $R_{k,l}$ approaches $E_S$.

2.2. Expressions for $OCR_{i,j}$ and $R_{i,j}$

The next step in producing model $Q_{k,l}$ values is to produce expressions for the energy resolution and output counting rates for each of the spectra. The resolution model is fairly straightforward. In the general case, excluding detector current (parallel) noise, the energy resolution in x-ray, γ-ray, and common particle detectors is given by:

$$R(\tau_p) = \left[R_{1/f}^2 + R_{Fano}^2 + \frac{r^2}{\tau_p}\right]^{1/2}, \tag{11}$$

where $R_{1/f}$ is from 1/f noise, $R_{Fano}$ is from Fano process contributions to the energy resolution, and the $1/\tau_p$ term reflects the dependence of series noise on the filter peaking time. When the peaking and falling times $\tau_1$ and $\tau_2$ are different, then their contributions add in quadrature as:

$$R(\tau_1, \tau_2) = \left[R_{1/f}^2 + R_{Fano}^2 + \frac{r_0^2}{2\tau_1} + \frac{r_0^2}{2\tau_2}\right]^{1/2}, \tag{12}$$

where the values of $R_{1/f}$, $R_{Fano}$, and $r_0$ have to be determined by fitting to a particular detector. Values appropriate to an 80 mm² planar HPGe detector used for detecting heavy metals in mining ores, which is a case of particular interest to us, are $R_{1/f}$=60 eV, $R_{Fano}$=365 eV at 80 keV, and $r_0$=534 eV. We also observe that $R_{1/f}$ and $R_{Fano}$ can be added in quadrature, since they will always occur together in our modeling work, to obtain a composite resolution $R^2_{F/f}$=137,000 eV² at 80 keV, while $r_0^2$=285,500 eV². Hence:

$$R(\tau_1, \tau_2) = \left[137,000 + \frac{142,750}{\tau_1} + \frac{142,750}{\tau_2}\right]^{1/2} eV. \tag{13}$$

In order to develop an expression for $OCR_{i,j}$, which is the counting rate produced by a peaking time $\tau_i$ and falling time $\tau_j$, we first recall that, for Poisson statistics the probability of finding an interval between events that exceeds $\tau_k$ at an input counting rate ICR is proportional to $\exp(-ICR\ \tau_k)$ Second, since our apparatus will be set up to use the longest possible peaking and falling times, a particular peaking time $\tau_k$, for example, will only be used if the interval exceeds $\tau_k$ but does not exceed $\tau_{k+1}$. This probability is given by $\exp(-ICR\ \tau_k) - \exp(-ICR\ \tau_{k+1})$, which we can denote by $P(k)-P(k+1)$. Because the same statistics apply to the falling time, the probability of succeeding with both values will be the product of two such differences. Since, for trapezoidal filters, the pileup inspection test is really for the sum of the peaking time plus gap time (or falling time plus gap time), we obtain the following general expression for $OCR_{i,j}$:

$$OCR_{i,j} = OCR(\tau_i, \tau_j) = ICR \exp(-2\tau_g ICR)[P(i) - P(i+1)][P(j) - P(j+1)], \quad (14)$$

where $P(k) = \exp(-ICR\ \tau_k)$, provided that k is a member of the filter set, and zero otherwise (i.e., if we only have 4 allowed peaking time values, then $P(5) = 0$).

2.3. Model Results for Specific Values of s and b

As stated above, to demonstrate the benefits of the multi-spectral method, we will examine a particularly difficult case—a very weak signal s against a strong background—by selecting a value of s equal to 1.0E-5 and a background value b of 2.0E-6. This is a very hard case: at an OCR of 100,000 cps, the signal will only be 1 cps, while the background in a resolution of 400 eV will be 80 cps! We will take the standard minimum detection limit (MDL) value of K=3 and assume a value of $E_S$=800 eV, which is about twice the detector's best resolution.

Figure 5:
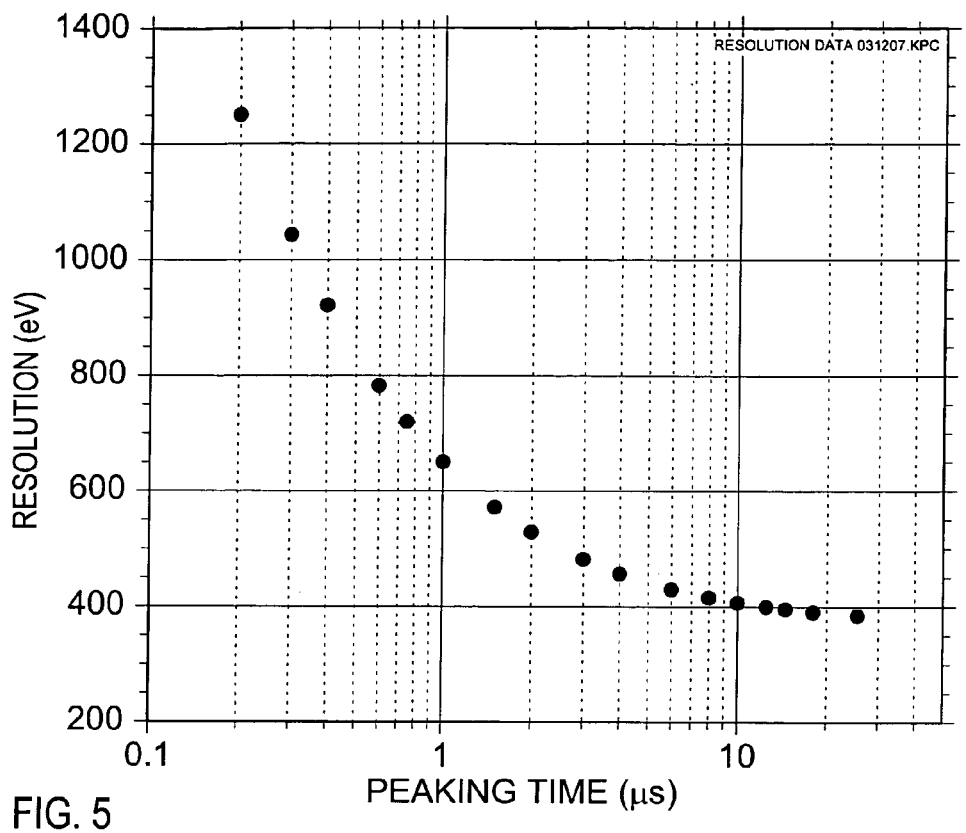
FIG. 5 shows the energy resolution versus peaking time for a typical planar HPGe detector when using a symmetrical trapezoidal filtering function.

FIG. 5 shows the energy resolution of the planar detector that we modeled in Sect. 2.2 for a symmetrical trapezoidal filter of peaking times $\tau_p$ from 200 ns to 25 μs. Peaking times shorter than 200 ns are usually not beneficial with detectors of this class, whose typical gap times of 200 ns then come to dominate the deadtime. The resolution is seen to vary from about 1,250 eV at the short end to just under 400 eV at the long end. For the symmetrical case shown, the maximum OCR varies from 460,000 cps to 7,000 cps across the same range.

We found solutions to Eqns. 13 and 14 into Eqn. 10 using a search routine to find maximum quality factor values. First we solved the single peaking time case. Using the LabView programming language, we computed, as a function of peaking time $\tau_p$, values of detector resolution $R(\tau_p, \tau_p)$ and OCR $(\tau_p, \tau_p)$ and substituted them into Eqn. 10 to find $Q_{1,1}$, as a function of τp assuming a particular value of ICR. Selecting the maximum value of $Q_{1,1}$, we then varied ICR to find the value that gave the maximum possible value of $Q_{1,1}$. For the single $\tau_p$ case the maximum occurred at ICR=300,000 cps, for $\tau_p$ equal to 1.475 μs, which produced a resolution of 578 eV, an OCR of 111,500 cps, and a quality factor Q equal to 4.18E-4. Thus, to achieve an MDL of 3 for this very weak peak it is necessary to count for $Q^{-1}$, or about 2,400 sec (40.0 minutes). It is important to note that even this value is a significant improvement over the time required by, for example, naively splitting $E_S$ between background and counting regions by selecting $\tau_p$ equal to 10ls, which gives a 400 eV resolution, but a maximum OCR of only 18,000 cps. The background counting rate is now only 1.44 cps and it takes 80,500 sec (22.4 hours) to achieve the desired MDL. The optimum single peaking time solution is therefore achieved by accepting a modest reduction in energy resolution (400 eV to 578 eV, or 45%) in exchange for an enormous increase in OCR (18,000 cps to 111,500 cps, 620%). The multi-spectral solution will now take this a step further by extracting even more information from the detector pulse stream.

For modeling purposes in the multi-spectral case we assume that there are four peaking/falling time values that are related by a mathematical formula. Then, given a minimum allowed $\tau_0$ and a maximum allowed $\tau_3$, we can compute quality factors for all allowed values of $\tau_0$ for with $\tau_3$ does not exceed its maximum allowed value. The value of $\tau_0$ that produces the maximum quality factor then defines the optimum filter set. In the present case we required the peaking times to differ by simple powers of two so that if the minimum peaking time $\tau_0$ is equal to $\tau_{p1}$ then the values of $\tau_1, \tau_2,$ and $\tau_3$ are 2 $\tau_{p1}$, 4 $\tau_{p1}$, and 8 $\tau_{p1}$, respectively. We selected this specific formula primarily because running sums over these lengths are particularly easy to normalize in our gate array architecture by simple bit shifting. More complex mathematical formulae could also be used to relate the filters' peaking times, with the search for a maximum quality factor being carried out in the same way. A more global search, which is described below, showed that the optimum peaking time ratios are slightly different from these values but, as the additional gain was minor in this model, we prefer the simpler design. The use of these peaking time ratios in the model, therefore, should not be taken as implying any limitations on the multi-spectral method itself.

Optimization in the multi-spectral model was then carried out similarly to the single peaking time case: a value of ICR was assumed and then the minimum peaking time $\tau_0$ varied to find a maximum in Q according to Eqn. 9. ICR was then varied to find a global maximum in Q. For the selected conditions this occurred $\tau_0$ equal to 0.575 μs and ICR=350,000 cps, giving a total OCR of 203,500 cps and a quality factor Q of 7.74E-4, for a counting time of 1,292 sec (21.5 minutes) to achieve MDL=3. The multi-spectral method thus cut the counting time essentially in half, a significant benefit when long counting times are required.

Three factors contributed to the multi-spectral method's enhanced performance. First, it allowed a 17% increased ICR to be used. Second, from this ICR it produced an 82% increase in OCR. Third, it also, on average, achieved improved energy resolution, compared to the single peaking time case. Sixteen possible filters can be made from the four values $\{\tau_0, \tau_1, \tau_2,$ and $\tau_3\}$ of rise/fall times, of which six (risetime, falltime) pairs (($\tau_r, \tau_f$) pairs) have equal energy resolution, deadtime and, hence, OCR (e.g., ($\tau_1, \tau_2$) and ($\tau_2, \tau_1$)). The tables show the OCR, energy resolution, and partial quality factor contributed by each ($\tau_r, \tau_f$)) pair. In considering the OCR numbers, it is important to recall that a particular ($\tau_r, \tau_f$) pair only processes pulses whose inter-pulse intervals exceed its values but not those of any other ($\tau_r, \tau_f$) pair, since we always process a pulse using the longest possible set of ($\tau_r, \tau_f$) values. Thus, in fact, most pulses are processed by intermediate ($\tau_r, \tau_f$) combinations and, of these, the ones processed by the longer ($\tau_r, \tau_f$) combinations add most strongly to the quality factor because of their better energy resolution values.

TABLE 1

Output count rate (OCR), in kcps, versus ($\tau_r, \tau_f$) values for the optimized value of $\tau_0$ equal to 0.575 μs and ICR equal to 350 kcps.

| | Fall | | | |
|---|---|---|---|---|
| Rise | 0.575 μs | 1.150 μs | 2.300 μs | 4.600 μs |
| 0.575 μs | 6.8 | 10.0 | 11.2 | 9.1 |
| 1.150 μs | 10.0 | 14.9 | 16.7 | 13.5 |
| 2.300 μs | 11.2 | 16.7 | 18.6 | 15.0 |
| 4.600 μs | 9.1 | 13.5 | 15.0 | 12.2 |

TABLE 2

Energy resolution, in eV, versus $(\tau_r, \tau_f)$ values for the optimized value of $\tau_0$ equal to 0.575 µs and ICR equal to 350 kcps.

| | Fall | | | |
|---|---|---|---|---|
| Rise | 0.575 µs | 1.150 µs | 2.300 µs | 4.600 µs |
| 0.575 µs | 795.9 | 713.7 | 668.8 | 645.2 |
| 1.150 µs | 713.7 | 620.7 | 568.5 | 540.5 |
| 2.300 µs | 668.8 | 568.5 | 511.0 | 479.7 |
| 4.600 µs | 645.2 | 540.5 | 479.7 | 446.2 |

TABLE 3

Partial quality factors, in sec$^{-1}$, versus $(\tau_r, \tau_f)$ values for the optimized value of $\tau_0$ equal to 0.575 µs and ICR equal to 350 kcps.

| | Fall | | | |
|---|---|---|---|---|
| Rise | 0.575 µs | 1.150 µs | 2.300 µs | 4.600 µs |
| 0.575 µs | 4.29E-7 | 1.37E-5 | 2.36E-5 | 2.27E-5 |
| 1.150 µs | 1.37E-5 | 4.39E-5 | 6.55E-5 | 6.08E-5 |
| 2.300 µs | 2.36E-5 | 6.55E-5 | 9.61E-5 | 8.91E-5 |
| 4.600 µs | 2.27E-5 | 6.08E-5 | 8.91E-5 | 8.30E-5 |

From Table 3, where only 16% of the quality factor derives from terms where at least one member of the $(\tau_r, \tau_f)$ pair is $\tau_0$, it seems, since the largest contributions to the quality factor come from the longest $(\tau_r, \tau_f)$ values, that some improvement might be gained by increasing $\tau_0$ since This turns out not to be the case however, for as $\tau_0$ is increased, the loss to the quality factor from loss of OCR with increasing $(\tau_r, \tau_f)$ values more than offsets the gain due to improved energy resolution. Thus, for example, if $\tau_0$ is doubled, to the value of $\tau_1$, then the quality factor drops from 7.74E-4 to 6.61E-4 and the quality factors are as shown in Table 4 where the former $(\tau_1, \tau_1)$ value is now in the $(\tau_0, \tau_0)$ position. The total OCR drops from 203.5 kcps to 136.0 kcps as we lose all the counts that could only be processed using at least one $(\tau_r, \tau_f)$ value of $\tau_0$ and gain no new ones from the longer $(\tau_r, \tau_f)$ values. The resolution from these longer $(\tau_r, \tau_f)$ values is 20 to 30 eV better than before, but these resolutions were already quite good, so the resultant 1% increase in quality factor is not nearly enough to offset the 16% loss due to the 70 kcps OCR lost with the shorter (risetime, falltime) values.

TABLE 4

Partial quality factors, in sec$^{-1}$, versus $(\tau_r, \tau_f)$ values for the non-optimized value of $\tau_0$ equal to 1.1500 µs and ICR equal to 350 kcps.

| | Fall | | | |
|---|---|---|---|---|
| Rise | 0.575 µs | 1.150 µs | 2.300 µs | 4.600 µs |
| 0.575 µs | 4.39E-5 | 6.55E-5 | 4.86E-5 | 1.30E-5 |
| 1.150 µs | 6.55E-5 | 9.61E-5 | 7.13E-5 | 1.91E-5 |
| 2.300 µs | 4.86E-5 | 7.13E-5 | 5.31E-5 | 1.43E-6 |
| 4.600 µs | 1.30E-5 | 1.91E-5 | 1.43E-6 | 3.5E-6 |

Figure 6:
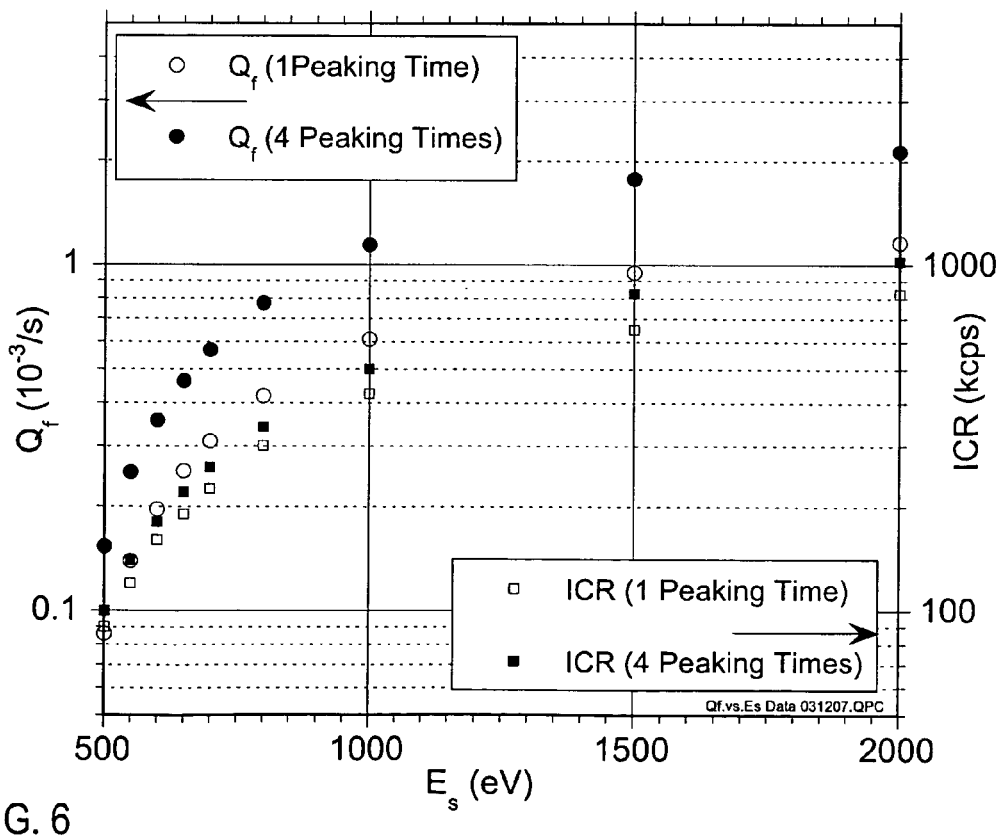
FIG. 6 shows model results, as a function of separation energy $E_S$ between a weak spectral line and its neighboring lines, of the optimum quality factor $Q_f$ and ICR values from a four interval multi-spectral spectrometer and from a spectrometer with a single, symmetrical trapezoidal filter.

The maximum quality factor that can be achieved is also a function of $E_S$, the energy separation between the line of interest and its neighbors. This is primarily due to the need for enough difference between $E_S$ and the energy resolution R to accurately measure the background. As $E_S$ becomes larger, R can be degraded by shorter peaking times that concomitantly increase allowable ICR and resultant OCR. As we have seen, quality factor $Q_f$ increases strongly with OCR. FIG. 6 shows the results of running the above optimization routines as a function of $E_S$. We see that $Q_f$ varies by over a factor of 10 as $E_S$ goes from 500 eV to 2000 eV, and approaches saturation by 2000 eV. The percentage improvement in going from a single peaking time to four peaking times is essentially independent of $E_S$, as is the percentage increase in optimum ICR that can be utilized.

Having now demonstrated that multi-spectral binning offers the potential of reducing counting times by factors of order two for weak spectral peaks sitting on strong backgrounds, we will now present several embodiments of the method.

3. Four Specific Embodiments

3.1 Four Running Sum Multi-Spectral Spectrometer

Figure 7A:
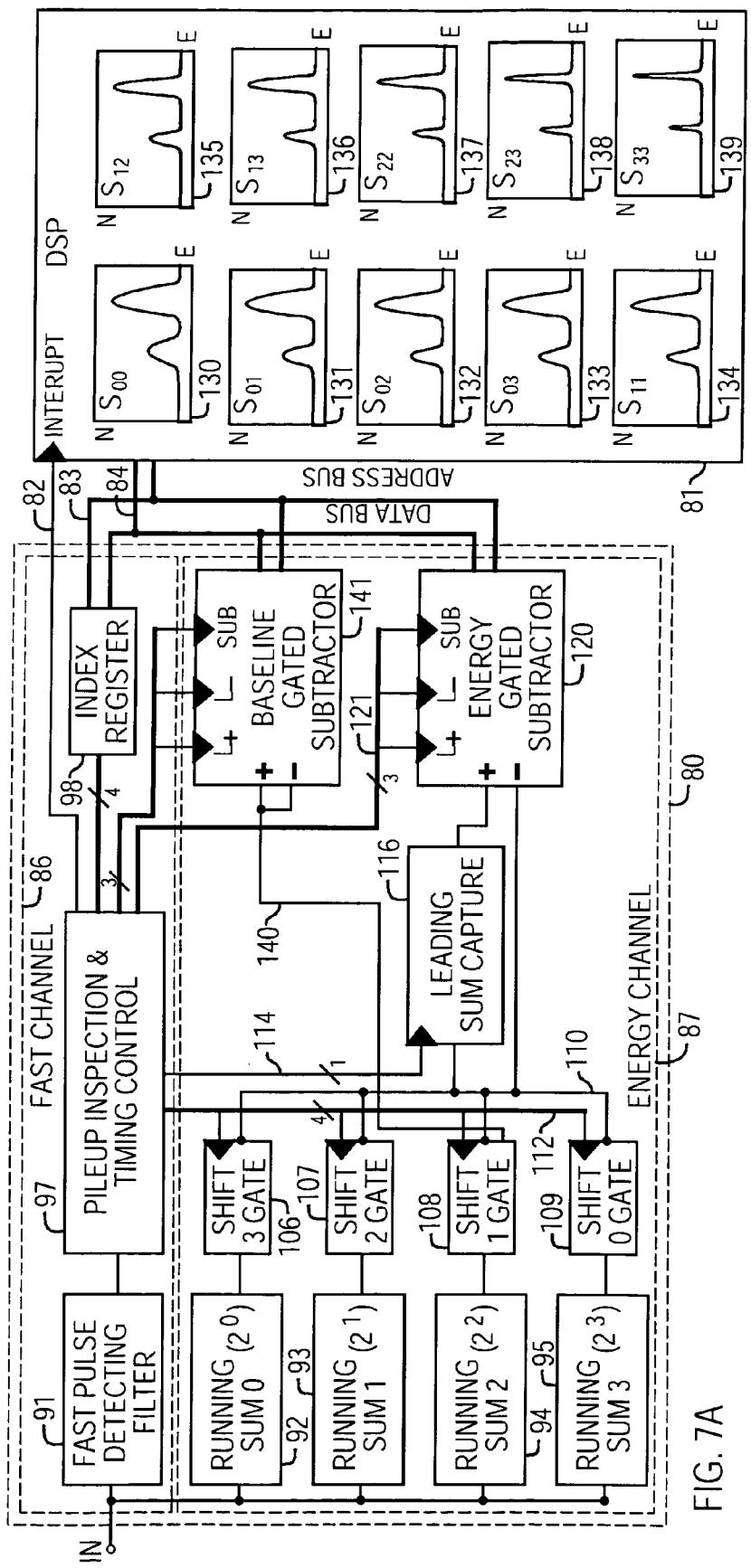
FIG. 7A shows a schematic of a time variant multi-spectral spectrometer that processes events with fixed set of four risetime and falltime values, uses both processing time values to index and sort the processed events, and also makes baseline measurements.
Figure 7B:
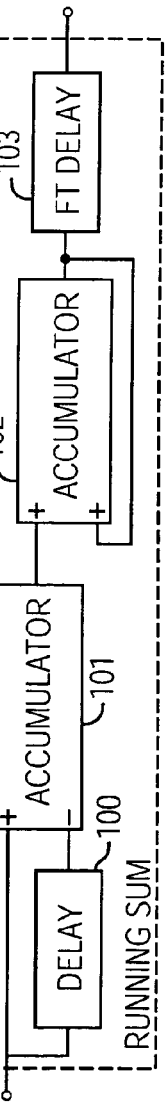
FIG. 7B shows a schematic of a typical running sum filter used in FIG. 7A.

Block diagrams for a digitally implemented multi-spectral spectrometer circuit intended to operate with a reset preamplifier are shown in FIGS. 7A and 7B. This preferred embodiment consists of the same two major blocks as in FIG. 4: a Spectrometer Body 80 (block 50 in FIG. 4) and a DSP block 81 (block 51 in FIG. 4). Block 80 is implemented using a programmable gate array, block 81 using a digital computing device, DSP, or gate array. If block 81 is a gate array, it may be either a partition in the same gate array that implements the Spectrometer Body 80 or a different gate array. As before, the two blocks communicate via Interrupt Line 82, Data Bus 83 and Address Bus 84. The input to block 80 is from an analog-to-digital (ADC) converter that digitizes the preamplifier's output signal. Spectrometer block 80 again has two major subdivisions: a Fast Channel 86 and an Energy Channel 87. The digitized input signal is split between a Fast Event Detecting Filter 91 in Fast Channel 86 and four Running Sum Filters 92, 93, 94, and 95 in Energy Channel 87. This number of Filters was selected because it gives reasonably good performance without using excessive gate array resources. It is clear from the design, however, that the number four is arbitrary here and any number greater than unity could be used instead.

The Fast Event Detecting Filter 91 is prior art, as described by Warburton et al. [WARBURTON—1997 and 1999B] and consists principally of a fast shaping filter whose output is compared to a preselected level and which emits a logic strobe pulse whenever it detects a pulse in the digitized preamplifier signal. If the spectrometer has to work with a wide range of input energies, then the pulse detecting circuit may become more complex and employ multiple filters and/or thresholds, as is known to the art.

The output of Filter 91 connects to Pileup Inspection and Timing Control circuit 97, which can store values in Index Register 98 to be read by the DSP 81. The Pileup Inspection and Timing Control circuit 97 is the spectrometer's brain. Its critical functions include measuring the time between detected pulses in the digitized preamplifier signal and using these measured times to control the circuit's operation, as will be explained below.

Throughout the following discussion it will be important to recall that different digital filtering operations require different numbers of clock cycles to complete and that these process times must be taken into account when designing the control circuitry. For example, if the preamplifier signal has a 100 ns risetime, the digital clock has a 25 ns "tick", and the 100 ns Fast Filter used to detect it has a three clock cycles processing delay, then possibly 6 or 7 clock cycles may pass between the pulse's arrival time and the emission of the logic strobe pulse. We will not usually discuss these process times explicitly in the following descriptions of circuit operation, both because they vary with the particular parts used in the implementation and because calculating and accommodating them is a standard part of digital design and well known to those skilled in the art.

As a single example of this issue, we show how Running Sum Filters 92 through 95 are constructed in FIG. 7B. The initial Filter structure is a Delay 100 and pair of Accumulators 101 and 102 as taught by Warburton [WARBURTON—1997 and 1999B]. The FT Delay 103 is added to delay the Running Sum's output by a time FT. Per the discussion of the preceding paragraph, this delay is inserted to provide time for the Fast Event Detecting Filter 91 to detect the presence of a new pulse in the input data stream before the pulse is incorporated into the Running Sum Filter's output. That is, since Detection Circuit 91 takes 6 or 7 cycles to detect a pulse, while the Running Sum Filter takes only 3 clock cycles to incorporate new data, we must delay it by 4 cycles so that we can capture its output before values from a new pulse are incorporated.

Because this implementation is for use with a reset preamplifier, we will use only very simple trapezoidal filters comprising one running sum captured before each pulse (the leading sum) and one captured after the pulse (the lagging sum). When working with feedback preamplifiers, particularly when ballistic deficit must be accounted for, it may become necessary to capture 3 or more running sum filter values, as taught by Warburton and Momayezi [WARBURTON—2003A], which can be readily carried out by a simple extension of the two capture methods taught below. Because the leading and lagging sums may have different numbers of summed terms (i.e., different summation times) they have to be normalized before they can be subtracted. This is particularly easy when the filter times differ by simple powers of 2, so that the length of the $k^{th}$ filter $\tau_k = 2^k \tau_0$. In this case we can use bit shifting to normalize all filter outputs to match the output of the longest filter, forming the difference D by:

$$D = 2^{3-m} \sum_{i=2^n N+G}^{2^m N + 2^n N + G - 1} y_i - 2^{3-n} \sum_{i=0}^{2^n N - 1} y_i \quad (15)$$

$$= 2^{3-m} S_{mLag} - 2^{3-n} S_{nLead},$$

where there are N preamplifier values $y_i$ in the shortest, $\tau_0$, running sum, $2^1$ N values in the $\tau_1 = 2\tau_0$ running sum, etc., and there is a flattop gap of length G approximately centered on the filtered pulse. For example, if the filter consists of a $\tau_2$ leading sum $S_{2Lead}$ and a $\tau_1$ lagging sum $S_{1Lag}$, then D will be given by $D = 4S_{1Lag} - 2S_{2Lead}$. This normalization allows the same scaling factor to be used to convert from D to event energy for all filter measurements.

The power of 2 weights required by Eqn. 15 are supplied in the circuit by Shift Gates 106, 107, 108, and 109, which are simply gated registers whose inputs are offset with respect to the outputs of their attached running sums by 3, 2, 1, or 0 bits, respectively. Since digital arithmetic is binary, these bit offsets correspond to multiplication by powers of 2. Therefore to load a weighted Running Sum value onto bus 110 for capture, the Timing Control 97 simply has to gate the appropriate Shift Gate using Gate Control Lines 112 to turn on its output. To capture a leading sum, the Timing Control 97 then uses Capture Control Lines 114 to load the active Shift Gate's output into the Leading Sum Capture register 116, from which it can be transferred to the positive input of Gated Subtracter 120 when Timing Control 97 asserts Gate $L_+$ using Subtracter Control Lines 121. Timing Control 97 captures Lagging sums directly into the Gated Subtracter's 120 negative input by asserting Gate $L_-$ via Subtracter Control Lines 121. Once acceptable values of both sums have been loaded into Gated Subtracter 120, Timing Control 97 initiates subtraction by strobing Gate SUB via Subtracter Control Lines 121.

The use of powers of 2 in Running Sum lengths is thereby seen to make the multi-spectral spectrometer particularly easy to implement with limited resources and it is therefore a preferred implementation for engineering reasons. However, there is no fundamental requirement for this choice of filter lengths and, as noted earlier, slightly different length ratios can be shown to give slightly superior quality factors $Q_f$. This example, therefore, should not be taken to limit the scope of the invention.

The output D from the Gated Subtracter 120 now represents the pulse's energy value and is ready to be indexed and placed into an appropriate spectrum. The Timing Control 97 accomplishes this by loading the lengths $L_1$ of the leading sum and $L_2$ of the lagging sum into Index Register 98 and signaling the DSP 81 via Interrupt Line 82. The DSP then uses Data Bus 83 and Address Bus 84 to read both the Index Register and the value D from the Gated Subtracter. The DSP then uses the value D to place a count into one of the ten possible spectra $S_{00}$ 130 through $S_{33}$ 139, selecting the appropriate spectrum based on the index values $L_1$ and $L_2$. For example, if the leading sum length $L_1$ was 2 (i.e., length is $\tau_0 * 2^2$) and the lagging sum length $L_2$ was 1 (i.e., length is $\tau_0 * 2^1$) then the count would be added to spectrum $S_{12}$ 135. In order to minimize the number of stored spectra, and not for any fundamental reason, we have included only a single member of the six pairs of spectra ($S_{ij}$ and $S_{ji}$, $i \neq j$), which have the same energy resolution, per Eqn. 13.

FIG. 8 demonstrates the timing decisions that the Timing Control circuit 97 must make to ensure the proper spectrometer function. The solid trace represents the preamplifier signal with four sloping regions representing four detector events. The Fast Event Trigger 81 detects the first (leftmost) event at the point $P_1$ 140. It measures a delay time to point $T_1$ 141 which is long enough to assure that the event pulse has fully settled and then starts a counter to determine the length of the longest running sum that can filter the signal before the arrival of the next pulse. When the timer reaches time 0 142 corresponding to the length of the Running Sum 0 92, then the output of Running Sum 0 is captured into the negative input of Gated Subtracter 120 as a lagging sum, as described above. When the timer reaches time 1 143, Running Sum 1 93 is similarly captured, and so on. When the next pulse is detected at $P_2$ 145, the Timing Control circuit 97 notes that Running Sum 1 was the longest sum (i.e., the filter with the longest filtering time) that fit into the interpulse region and causes the value of Running Sum 1 at point 1 146 to be captured into Leading Sum Buffer 116 for the next pulse, the FT time delay allowing the value of the Sum at an earlier time 1 146 than the pulse detection time $P_2$ 145 to be captured, as discussed above.

Since the interval between the second pulse $P_2$ 145 and the third pulse at $P_3$ 147 is long enough to accommodate the Running Sum 2 filter 94, its values are captured as a lagging sum at 2 148 and as a leading sum at 2 149. Typically the leading sum capture time for one pulse comes after the lagging sum capture time for the previous pulse since interpulse intervals are seldom exact multiples of a Running Sum filter length. This does occur occasionally, as shown following the third pulse $P_3$ 147, where the interpulse interval to the fourth pulse $P_4$ 150 is exactly the length of Running Sum 0 92. The lagging capture time 0 151 and leading capture time 0 152 are exactly the same in this case and the logic implemented in the Timing Control Circuit 97 must be general enough to accommodate these occurrences. We observe that, in this design, the Running Sum filters run continuously and it is up to the counters and logic in the Timing Control Circuit 97 to make sure that they are only filtering data from interpulse regions when they are captured. This is also why the design has a Leading Sum Capture buffer 116 but no Lagging Sum Capture buffer. Once a valid lagging sum has been captured, it takes a few cycles to confirm validity and complete the Gated Subtraction operation. Because a new leading sum cannot be loaded into the Gated Subtractor 120 until the subtraction operation is complete, it must be temporarily buffered. Hence the detection of a pulse (e.g., at $P_4$ 150) causes its leading sum to be buffered into Leading Sum Capture 116, the subtraction for the previous pulse to occur within a clock cycle or two, and then the new leading sum to be loaded into Gated Subtractor 120 one or two clock cycles after that. These times need not be precise, the leading sum must only really be loaded before the minimum time for the next possible leading sum capture, namely at lagging sum capture time 0 153.

3.2 Four Running Sum Multi-Spectral Spectrometer with Baseline Correction

Baseline corrections for this multi-spectral spectrometer can be made by extending the method taught by Warburton et al. [WARBURTON, 2003B] wherein values captured from a shorter "sampling" filter at times when no pulse is being filtered are used to compute the baseline for a longer filter. As shown there, provided both filters are linear filters, the longer filter's baseline can be computed simply by multiplying the sampling filter's values by a constant, where the constant depends in detail upon the filter lengths and gaps of the two filters. In fact, nothing in the method requires the length of the corrected filter to be longer than that of the sampling filter, a point which we will exploit here. There are several ways to implement the correction.

In a first method, we might use a single baseline sampling filter and scale its values by ten different constants for the ten different unique filter combinations associated with the spectra $S_{00}$ 130 through $S_{33}$ 139. In the preferred implementation shown in FIG. 7A we must choose between using the shortest filter possible ($S_{00}$), which gets the most samples but has the worst energy resolution, and a longer filter that has better energy resolution but fewer counts. Somewhat surprisingly, $S_{22}$ is a reasonable engineering compromise, in spite of its length. As Table 2 shows, it has relatively good energy resolution—511 eV. Further, it captures an adequate number of samples at the point of optimum throughput, as may be found from Table 1, which allows us to estimate the occurrence rate of intervals that are at least twice Sum 2 in length—i.e., the sum of all table values in the 4.60 μs row plus the sum of all table values in the 4.60 μs column, divided by 2, since each interpulse interval is associated with two pulses. This gives a baseline sample rate of 50 kcps at an input rate of 350 kcps, which is adequate for the baseline to track low frequency noise fluctuations on the millisecond time scale.

The circuit that implements baseline capture is included in FIG. 7A, where the positive and negative inputs to Gated Subtracter 141 are connected together to an ungated output of Shift Gate 2 108. Little additional logic circuitry in the Timing Control circuit 97 is required. Whenever (referring to FIG. 8) the Pileup Inspection circuit detects that Running Sum 2 94 is a valid lagging sum (e.g., 2 148) it simultaneously loads its shifted value from Shift 1 Gate 108 both into the negative input of both Energy Gated Subtracter 120 and Baseline Gated Subtracter 141. If it finds that Running Sum 3 95 is a valid lagging sum, it simultaneously loads the shifted value of Running Sum 2 94 from Shift 1 Gate 108 into the negative input of the Baseline Gated Subtracter 141 as it loads Running Sum 3 95 from Shift 0 Gate 109 into the negative input of the Energy Gated Subtracter 120 and then strobes the SUB gate on both to produce both a baseline value and an energy value. If another pulse is detected before Running Sum 3 can be loaded, then the Running Sum 2 value stored in Baseline Gated Subtracter 141 will just be overwritten by the next detected Running Sum 2 value. Whenever the DSP 81 is not otherwise busy it can read the most recent baseline value from the Baseline Gated Subtracter 141 for processing and updating the estimate of the mean baseline value <b>. The required 10 baseline values can then be computed and stored in the DSP for use as needed.

However, for very high count rate operation, we prefer to do baseline subtraction in the Energy Channel 87 logic before the DSP 81 reads energy values, removing this computational load from the DSP. In this case it is no longer preferred to store 10 baseline values in the logic array since the load on DSP 81 to update and download 10 values each time the mean baseline <b> is recomputed can become limiting.

When all Running Sum filter lengths are powers of 2, so that length $L_i = 2^i L_0$, however, we can greatly simplify the situation and load at most two baseline values for any number of Running Sum filters. We show this by reference to FIG. 9, which shows a pulse of amplitude A starting at value $C_0$ in a preamplifier signal whose slope $\Delta v/\Delta t$ per clock cycle is s. This signal is filtered with a Leading Sum of length $L_i$ and a Lagging Sum of length $L_j$, separated by a gap of length G, where all times are measured in clock cycles. The centroids of the two Running Sums are $C_i$ and $C_j$, respectively. Now, Eqn. 15 becomes:

$$D = 2^{3-j} L_j C_j - 2^{3-i} L_i C_i, \quad (16)$$

where $$C_i = C_0 - \left(\frac{L_i + G}{2}\right) s \text{ and } C_j = C_0 + A + \left(\frac{L_j + G}{2}\right) s, \quad (17)$$

the slope s being negative. Substituting Eqn. 17 into Eqn. 16 and noting that $$2^{3-j} L_j = 2^{3-i} L_i = 2^3 L = L_3, \quad (18)$$

we find that $$D = L_3 A + 2^{j-3}\left(\frac{L_3^2 s}{2}\right) + 2^{i-3}\left(\frac{L_3^2 s}{2}\right) + L_3 G s. \quad (19)$$

Here the term $L_3 A$ is the length $L_3$ of the Running Sum 3 times the pulse amplitude A and therefore is proportional to the pulse energy. The remaining terms contain the slope s of the preamplifier signal and hence are baseline terms, arising from the Lagging Sum filter length $L_j$, Leading Sum filter length $L_i$, and the gap length G in the trapezoidal filter. Eqn. 19 shows that we can easily correct D for the baseline components by first subtracting the baseline term ($L_3^2 s/2$) twice, appropriately bit shifted by j−3 and i−3 places, and then subtracting $L_3 Gs$ once. Thus, by updating only these two terms into our gate array each time the average baseline <b> is corrected, we can carry out baseline corrections within the slow energy channel "on the fly" using only the logical operations of shifting and addition. These operations are well understood by those skilled in the art of digital design and are not shown in FIG. 7A. We further note that if the gap length G is constrained to be a power of 2 of the filter length $L_3$ (e.g., $L_0/4$), then we can write $G = 2^{g-4} L_3 = 2^{g-1} L_0$ so that $$L_3 Gs = 2^{g-3}\left(\frac{L_3^2 s}{2}\right), \quad (20)$$

and D in Eqn. 19 can be baseline corrected using only a single loaded baseline value, since Eqn. 19 becomes:

$$D = L_3 A + \left(\frac{L_3^2 s}{2}\right)(2^{j-3} + 2^{i-3} + 2^{g-3}) \quad (21)$$

The relationship between the bracketed term ($L_3^2 s/2$) and the average baseline <b> turns out to be simple. As discussed above, we will compute each new estimate of the baseline b by taking the difference between two consecutive (i.e., G=0) values of the Running Sum 2 94 of length $L_2$, shifted one bit by Shift 1 Gate 108. The general case, where the baseline filter is the difference between two consecutive Running Sums 2 94 of length $L_\beta = 2^\beta \tau_0$ multiplied by $2^{3-\beta}$, we find from Eqn. 21, where A is zero and we eliminate the $2^{g-3}$ term because G=0, that the value of this baseline measurement $D_b$ of b is:

$$b = D_b = \left(\frac{L_3^2 s}{2}\right)(2^{\beta-3} + 2^{\beta-3}) = 2^{\beta-2}\left(\frac{L_3^2 s}{2}\right), \quad (22)$$

which, for our β=2 case, gives a direct estimate of the bracketed term ($L_3^2 s/2$). After using b to update an averaged estimate <b> of b using any of the techniques described by Warburton et al. [WARBURTON, 2003A], <b> and $L_3 Gs/2 = \langle b \rangle G/L_3$ can then be directly loaded into the gate array to baseline correct captured values of D as indicated by Eqn. 19. This gives:

$$L_3 A = D - D_b\left(2^{j-\beta-1} + 2^{i-\beta-1} + 2^{-\beta}\frac{G}{L_0}\right) = D - D_{BKG}, \quad (23)$$

where we have used Eqn. 18 to replace $L_3$ with $L_0$. In cases where Eqn. 20 applies, this gives:

$$D_{BKG} = D_b(2^{j-\beta-1} + 2^{i-\beta-1} + 2^{g-\beta-1}) \quad (24)$$

Either correction may be readily carried out for each captured D value and produces the value $L_3 A$ that is directly proportional to the event energy and so may be scaled into energy units using a single multiplication in the DSP 81 before being indexed and binned in the appropriate spectrum. When, as in our example, β=2, then the powers of 2 multiplying $D_b$ simply become j−3, i−3, and g−3, respectively. In the general case where there are N filter lengths, rather than four, we can simply replace $L_3$ in Eqns. 19-24 with $2^{N-1}L_0$ and the derivations proceed unchanged. In particular, the baseline correction of Eqn. 24 using $D_b$ remains unchanged.

3.3 Multi-Spectral Spectrometer Using Adaptive Running Sum Filtering

Figure 10:
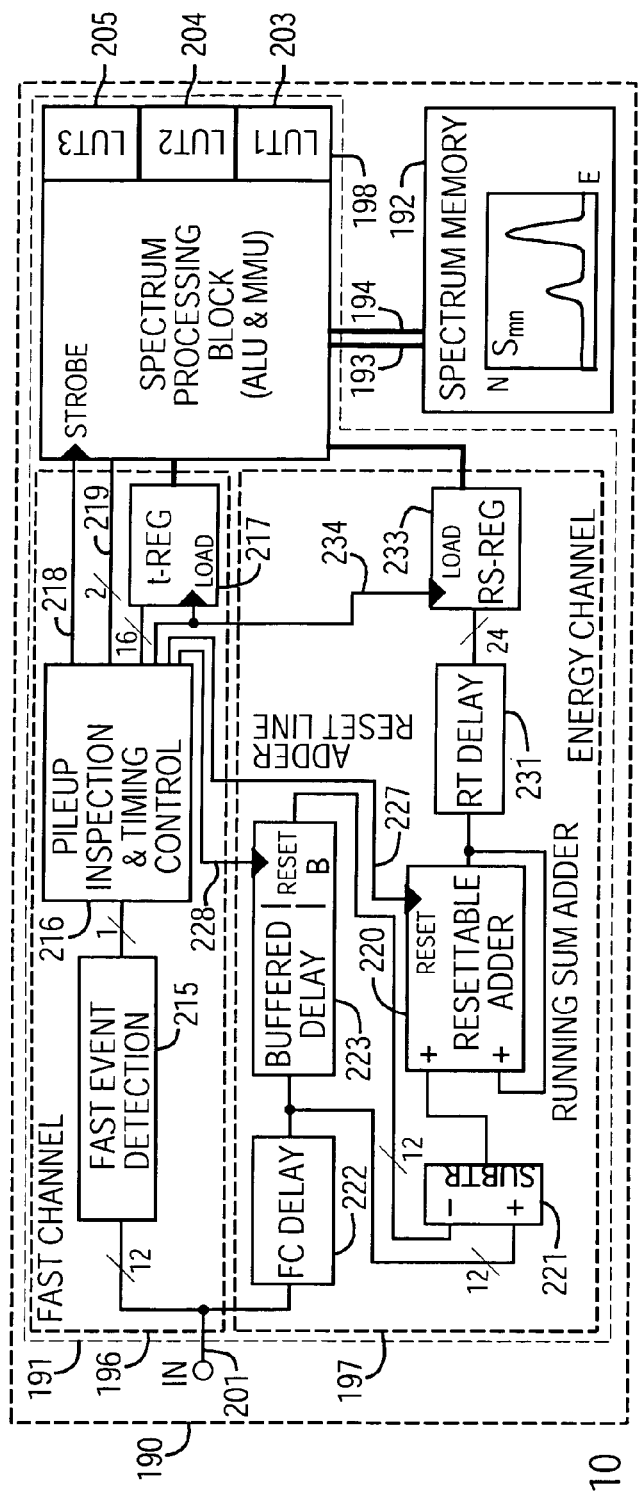
FIG. 10 shows a schematic of a time variant multi-spectral spectrometer that processes events with a continuous range of risetime and falltime values, indexes and sorts the processed events according to the filter lengths used.

FIG. 10 shows a spectrometer circuit embodying our multi-spectral concept that uses fully adaptive running sums. Between each pair of detected pulses it captures the longest possible running sum of sample values subject to three constraints: 1) that the time between the pulses exceeds some minimum time $t_{min}$; 2) that the sum exclude all parts of the pulses themselves; and, 3) if the time between the two pulses exceeds some maximum time $t_{max}$, then it collects leading and lagging filter sums of length $\tau_{max}$, similarly to the circuit shown in FIG. 7A. The latter condition is imposed because our goal is to obtain optimal filtering for each pulse and it is well known that for most detectors there is some maximum filtering time $\tau_{max}$ beyond which energy resolution ceases to improve and begins to degrade instead. Since we have complete freedom to select our filtering times on a pulse-by-pulse basis, we therefore cease filtering when we reach this maximum value.

The spectrometer 190, which is digitally implemented, comprises two blocks: a field programmable gate array (FPGA) 191 and an addressable memory 192; the two being connected by an address bus 193 and a data bus 194. Because FPGAs can now be obtained that include both multiplying capability and storage (e.g., the Xilinx Virtex II series), in this design we will split the spectrometer's MCA function (i.e., block 25 in FIG. 1 or block 81 in FIG. 7A) between the FPGA 191, which will supply arithmetic and memory management functions, and a separate memory 192, in which we will store the multiple spectra that we generate.

The FPGA is therefore subdivided into a Fast Channel 196, an Energy Channel 197, and a Spectrum Processing Block in which Arithmetic Logic Unit (ALU) and Memory Management Unit (MMU) capabilities have been implemented. We will not dwell on the issues of how these capabilities are implemented, since they are well known to those skilled in the art of logic design using FPGAs. The Fast Channel contains a Fast Event Detecting Filter 215, which is identical to the same component 91 in FIG. 7A, attached to a Pileup Inspection and Timing Control 216 (which operates on similar principles to the same component 97 in FIG. 7A) that connects to a t-Register 217 for capturing time values detected by the Timing Control 216. The Fast Channel receives its Input 201 from an ADC that digitizes the output of the preamplifier 10 that connects the spectrometer to the detector 10. The heart of the Energy Channel 197 is the Resettable Adder 220 whose input is fed by Subtracter 221. The Subtracter's positive input connects to Input 201 via FC Delay 222 and its negative input connects to Buffered Delay 223, whose input is also the FC Delay 222. The Buffered Delay is just a digital delay of length $L_{max}$, where $L_{max}$ times the clock period equals $\tau_{mzx}$, whose output is buffered by a register whose value is zero whenever the reset gate is asserted and the output of the delay otherwise. The function of the FC Delay 222 is to delay signal flow in Energy Channel 198 by the amount of Fast Channel delay introduced by Fast Event Detection 215 and Timing Control 216 per the earlier discussion in Sect. 3.1, which significantly simplifies the control logic in Timing Control 216. The output of Resettable Adder 220 connects via RT Delay 231, which has the same function as in FIG. 7A, to a Running Sum (RS) Register 233 which can load sums from the Adder.

The operation of this circuit can be understood by reference to FIG. 11, which is similar to FIG. 8. We note that all times are integers in units of clock cycles. When a pulse is detected at $P_1$ 230, Timing Control 216 asserts the Reset Lines 227 and 228 to reset Adder 220 and to force the output of Buffered Delay 222 to zero. It waits until $S_1$ 231 for the pulse risetime to settle and releases the Adder Reset line 227, starting the Adder. At this time it also starts an internal counter to measure the interval to the next pulse. When that next pulse is detected at $P_2$ 236 it stops the clock, resets the Adder 220 and Delay 222 again, and also strobes Load Line 234 to RS Register 233 and t-Register 217 to capture the delayed output from Adder 220 and the value of the interpulse interval from its clock. The RT Delay 231 serves the same function as in the previous design, assuring that, while the load operation is strobed at $P_2$ 236, the captured value is the running sum between $S_1$ 231 and endpoint $E_1$ 241 which does not include any part of the newly detected pulse. Finally, it uses Strobe Line 218 to signal the Spectrum Processing Block 198 that values are ready for processing.

The constraint of a maximum filtering length is enforced as follows. If the value of the interpulse-counter in Timing Control 216 reaches the preset value $L_{max}$ then Timing Control 216 stops the counter and releases Reset Line 228 so that the output of Buffered Delay 222 reaches the negative input of Subtracter 221. Because the length of the Buffered Delay is $L_{max}$ the running sum length now becomes fixed at $L_{max}$ until the next pulse is detected. It then waits a time RT and then strobes Load Line 234, which loads $L_{max}$ into the t-Register 217 and the value of the running sum at endpoint $E_1$ 245 into RS-Register. When the next pulse is detected at $P_3$ 246, the Timing Control 216 carries out its usual routine, strobing Load Line 234 again and asserting Reset Lines 227 and 228. This loads the value of $L_{max}$ into the t-Register 217 a second time and the running sum value at $E_2$ 247 into RS-Register 233. If the time interval to the next detected pulse (e.g., $P_4$ 250) is shorter than the allowed minimum then Timing Control 216 carries out its usual resetting operations but does not strobe Load Line 234 so that no values are captured into RS-Register 233 or t-Register 217 for that inter-event interval. We observe that in this spectrometer design, there is no difference between the case where the captured running sum length is exactly $L_{max}$ (e.g., between $P_4$ 250 and $P_5$ 252) or less—only a single set of values is captured in both cases (i.e., at $E_1$ 253).

Thus when the Spectrum Processing Block 198 reads the RS-Register 233 and t-Register 217, it obtains a pair of values: one member of the pair being a Running Sum Length L (in clock cycles) and the other member of the pair being its associated Running Sum Value. In order to process these values to correctly obtain pulse amplitudes, the Spectrum Processing Block's 198 ALU requires additional information, since the captured pair may represent a leading sum, a lagging sum, or both, depending upon the lengths of the intervals between the pulses in the data stream. Thus, referring to FIG. 11, the pair captured at $E_1$ 241 is both a lagging sum for pulse $P_1$ 230 and a leading sum for pulse $P_2$ 236. The pair captured at $E_1$ 245 is a lagging sum for $P_2$ 236, while the pair captured at $E_2$ 247 is a leading sum for pulse $P_3$. Because pulses $P_3$ 246 and $P_4$ 250 pile up, the next pair captured at $E_1$ 253 is designated only as a leading sum. The resultant occurrence of two leading sums in the data stream informs the ALU that a pileup occurred and that it should not attempt to reconstruct the energy of pulse $P_3$ 246. Obviously, a sequence of multiple pileups will produce a sequence of leading sum pairs, which the ALU will correctly ignore. Only cases of a leading sum followed by a lagging sum are processed to recover an energy value. Timing Control 216 sends this information to the ALU using the two wires 219, assigning one to designate leading sum status and the other to designate lagging sum status.

Processing within the ALU proceeds as follows. It normalizes the Running Sum $S_i$ value by dividing by its Length $L_i$ (the t-Register value). Since only multiplication is readily possible in the FPGA, the ALU uses the value of $L_i$ to retrieve its previously stored inverse $L_i^{-1}$ from Lookup Table 1 (LUT1) 203 and then multiplying $S_i$ by $L_i^{-1}$ to obtain $s_i$. LUT1 is not particularly large. For example, if all sum times from 0.5 to 10 µs are allowed in a spectrometer running with a 40 MHz ADC, only 380 values will be required. If $s_i$ came from a lagging sum, then the ALU subtracts it from the value $s_{i-1}$ of the previous leading sum to obtain the energy $E_{i-1}$ of pulse $P_{i-1}$. If $s_i$ is also a leading sum then the ALU completes its operation by storing $s_i$ as a leading sum and then waits for the next lagging sum. If, on the other hand, $S_i$ is designated only as a leading sum, the ALU simply computes $s_i$ as above, stores it as a leading sum (overwriting any previous leading sum) and then waits for the next lagging sum. In this case it does not compute an energy value. Each computed energy $E_i$ is passed to the Memory Manager Unit, together with the pair of index values ($L_{i+1}$, $L_i$) to be written into the Spectrum Memory 192 using Address Bus 193 and Data Bus 194.

An important question is how to select the spectrum into which the value $E_i$ should be binned. If a unique spectrum is defined for each pair of index values ($L_{i+1}$, $L_i$) there will be $380^2$ or 144,400 spectra of which 72,390 have theoretically unique energy resolutions. In practice, however, such a degree of refinement will be neither detectable nor useful. We therefore use Eqn. 13 or an equivalent form to map out regions in the ($L_{j+1}$, $L_j$) index plane whose energy resolution is "comparable". Continuing with our 40 MHz ADC example, Eqn. 13 becomes:

$$R(L_1, L_2) = 378 \text{ eV}\left[0.95972 + \frac{40}{L_1} + \frac{40}{L_2}\right]^{1/2}, \quad (25)$$

which varies between 407 eV and 1,130 eV as $L_1$ and $L_2$ vary between 10 (0.25 µs) and 400 (10 µs). As an illustrative example, we might divide this interval into 16 comparable energy resolutions. Solving $1{,}130 = 407*(1+x)^{16}$, we find x equals 6.6% and the energy boundaries are given by $E(n) = 407*(1+x)^n$. Obviously we can define coarser divisions to obtain fewer spectra or finer divisions to obtain more spectra, but using values of n that are powers of two are particularly convenient.

Figure 12:
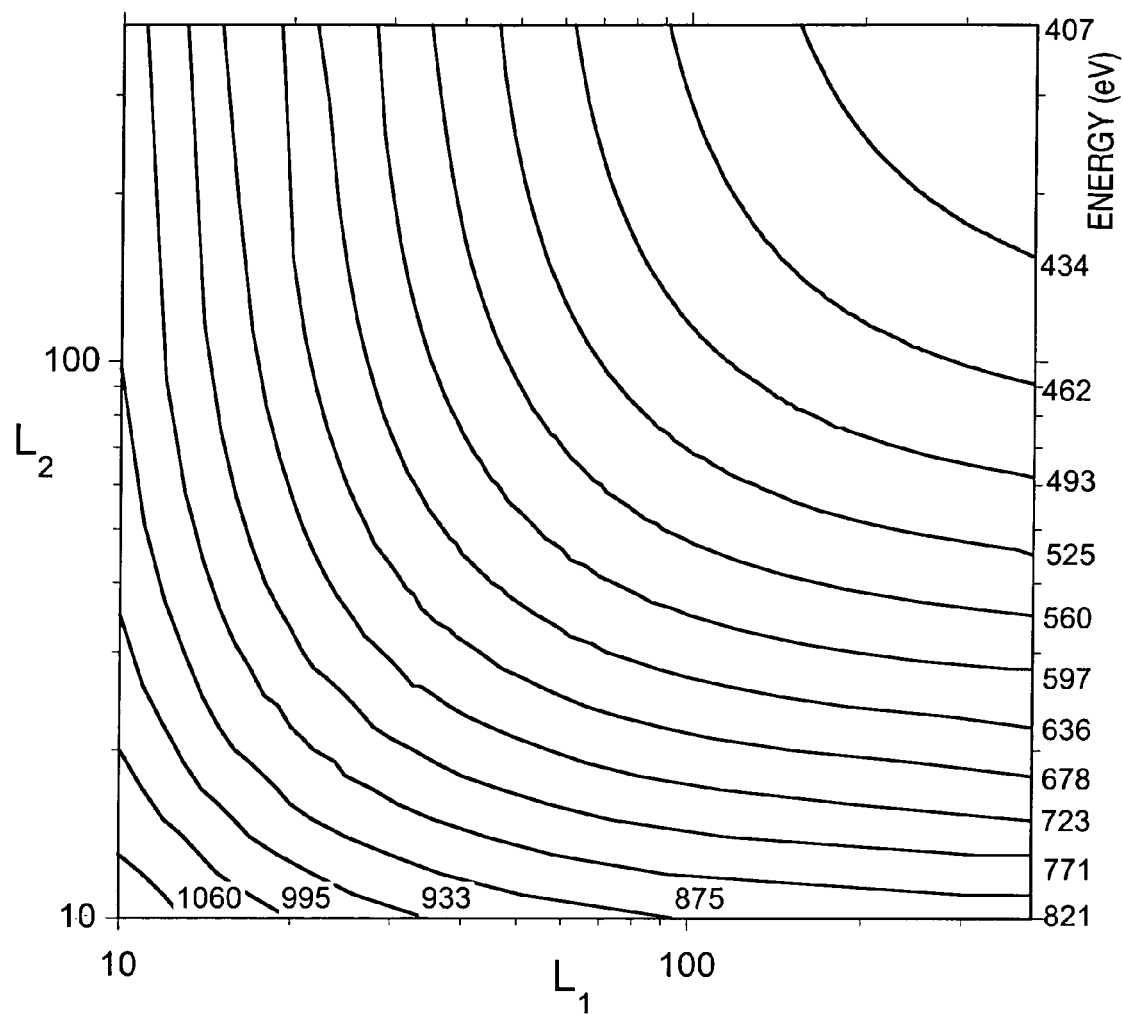
FIG. 12 shows a contour plot of expected energy resolution versus leading and lagging filter times for the spectrometer of FIG. 10.

FIG. 12 shows the resultant map, a log-log plot of the energy resolution boundaries as a function of $L_1$ and $L_2$ index values. A fast method is still required to determine which spectrum a particular energy value should be binned into, given its index values. Various methods are possible involving tests on the specific values of $L_1$ and $L_2$, but a particularly convenient method for gate array implementation is by the method of indirect lookup. We first divide FIG. 12 into 1024 equal areas by dividing each axis into 32 ($2^5$) energy intervals. The energy intervals may be equal or not, as proves to be most convenient. Since the energy map FIG. 12 is symmetric about the $L_1 = L_2$ axis, a simplifying step is to require that the $j^{th}$ $L_1$ energy interval equals the $j^{th}$ $L_2$ energy interval, for all intervals, but this is not a necessary requirement of the method. Then each of these areas is filled with the memory address of the spectrum in which the majority of its area lies to create a 1K lookup table LUT3 205 containing Spectrum Address Matrix. Since there are 16 spectra, each matrix value is only 4 bits, so the table is only 4 Kb in size.

A second lookup table LUT3 204 is then filled with Index Conversion Values to convert the index values $L_1$ and $L_2$ into Spectrum Address Matrix indices $J_1$ and $J_2$, depending upon which energy intervals $L_1$ and $L_2$ fall into. Because of our restriction that corresponding $L_1$ and $L_2$ intervals were the same, we need only a single lookup table for this purpose. For example, if $L_1$ values between 57 and 83 are assigned to energy interval 3, then all locations 57 through 83 inclusive in LUT3 are filled with the value 3.

To locate the spectrum associated with index ($L_1$, $L_2$) we now proceed as follows. First, use the index $L_1$ as an address in LUT2 204 to retrieve indices $J_1$ for the Spectrum Address Matrix and repeat with $L_2$ to retrieve $J_2$. Shift $J_2$ by 5 bits and add to $J_1$ to compute $32J_2 + J_1$ as an address LUT3 205 to retrieve a Spectrum Address that is then provided to the Memory Manager Unit to increment the correct spectrum in Spectrum Memory 192.

This method is very fast and also relatively accurate, given the 6.6% range of energy resolutions assigned to the same spectrum. In the general application it is necessary to consider how much fluctuation in the energy resolution in a spectrum occurs and is acceptable as a function of varying input count rate. This will set the allowable percentage widths of the resolution test used to create the resolution map and the number of scale divisions used to sort $L_1$ and $L_2$ values. Energy resolutions in the spectra produced by this method are relatively insensitive to fluctuations in ICR because, while changes in ICR can dramatically change the fractions of counts assigned to each spectrum, the change in distribution across the different $L_1$ and $L_2$ values within a single spectrum is far smaller. Clearly too, these widths can be adjusted by adjusting the maximum and minimum allowed interpulse times and hence energy resolutions produced. If, however, no fluctuation whatsoever can be tolerated in energy resolution with counting rate, then the design presented in Sect. 3.1 is preferred and should be employed.

3.4 Multi-Spectral Spectrometer Using Adaptive Running Sum Filtering with Baseline Correction Baseline correction in the spectrometer of FIG. 10 is more complex than in simple digital spectrometers because of the large number of possible pairs of leading and lagging filter lengths that might filter a given pulse. Clearly we do not want to have to compute and store all these baseline values each time we update our baseline estimate. Analysis of the problem shows that the baseline correction is separable by filter—baseline correcting each running sum baseline corrects their difference, which is the desired energy. Looking at FIG. 9, we can derive the baseline contribution to a single running sum (here the lagging sum) between the point G/2 after $C_0$ and the point L+G/2 later:

$$RS = \sum_{i=G/2}^{L+G/2} (C_0 + A + is) = (L+1)(C_0 + A) + (L+G)\left(\frac{L+1}{2}\right)s, \quad (26)$$

where s is the average slope in the preamplifier signal per time step. In Eqn. 26 (L+1)A is the amplitude term that measures the pulse's energy, $(L+1)C_0$ will be cancelled by the scaled leading running sum, and the remainder is the baseline. Note that if there is a gap filter between −G/2 and +G/2, its baseline term will be zero.

Assuming that, either using the methods of Warburton et al. [WARBURTON, 2003B] or those described above, we have means to determine the average preamplifier slope s, then there are at least two ways to proceed. The first is to download updated values of s/2 into the ALU 198 and, since G is known and Timing Control 216 produces a value of L for each running sum, compute (L+G)(L+1)s/2 for each captured running sum. This presumes that the ALU is capable of multiplication, as we assumed for the FIG. 10 design. In designs using the topology of FIG. 7A, the length L would be passed to the DSP 81 along with the value of the Running Sum and the DSP could make the baseline correction. Because the multiplication operations can be pipelined in the FPGA, there would be no reduction of overall throughput, compared to the DSP implementation, where the additional operations would reduce maximum throughput.

Figure 13:
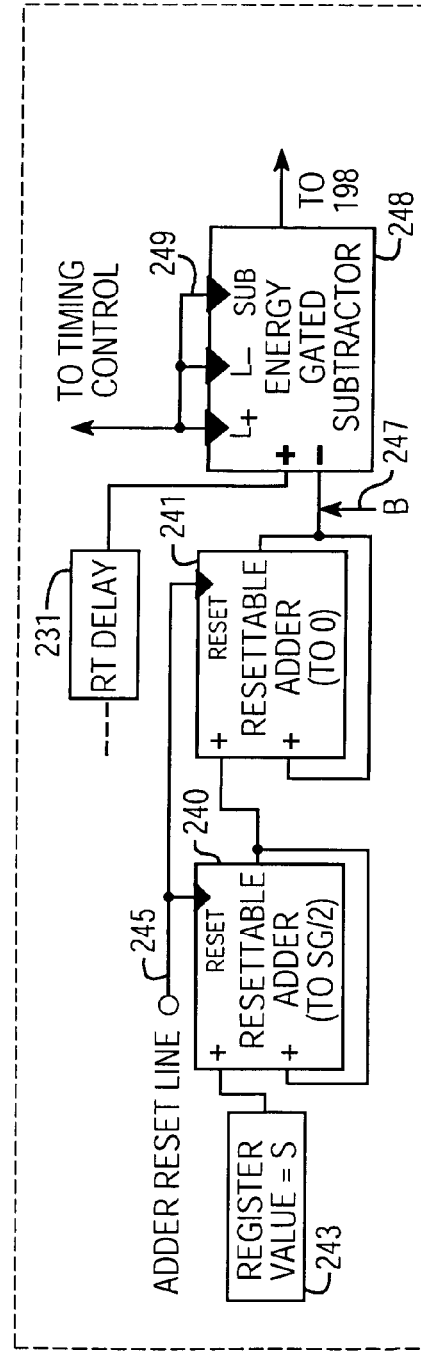
FIG. 13 shows a circuit that allows baseline corrections to be computed on a pulse by pulse basis the spectrometer of FIG. 10.

A second approach is to generate the baseline correction term in the FPGA at the same time as the Running Sum is collected. FIG. 13 shows the design, whose core is a pair of Resettable Adders 240 and 241 connected as shown, with a Register 243 feeding the value s into the first Adder 240. When Adder Reset Line 245 is released, Adder 240 is reset to the value SG/2 and Adder 241 is reset to zero. Under these conditions, the output of the second Adder 241 becomes:

$$B = \sum_{i=0}^{L} \left(\frac{G}{2} + i\right)s = s(L+1)\left(\frac{G+L}{2}\right) = (L+G)\left(\frac{L+1}{2}\right)s, \quad (27)$$

which is precisely the term required to baseline correct Running Sum RS in Eqn. 26. Hence the circuit can be activated to count as long as the Running Sum is collected, making the obvious adjustments for the RT Delay time to generate baseline corrections on the fly. The circuit would be integrated into FIG. 10 as shown in the rest of FIG. 13, where a Gated Subtracter 248 replaces RS Register 233 in FIG. 10. The baseline correction output B from Adder 241 is loaded into the Subtracter's negative input by the Timing Control 216 using Control Lines 249. The Running Sum is similarly loaded to the positive input from RT Delay 231 and the difference taken by strobing the Subtracter's SUB gate. The baseline corrected difference is then passed to the Spectrum Processing Block 198 just as before to be used in computing pulse energies. From Eqn. 27 we observe that if we take the difference of two successive (i.e., G=0) running sum filters of length L, we will obtain the difference ΔB=L(L+1)s, from which an estimate of the slope s is readily obtained.

4. Optimizing the Filter Set

In Sect. 2.3 we described a simple method for selecting an optimum set of filters for the case of four filters, assuming that the filters' peaking times were related by a mathematical formula so that specifying the shortest peaking time $\tau_0$ specifies all the peaking times. This relationship, plus constraints on a minimum allowed $\tau_0$ and a maximum allowed $\tau_n$ typically limits the number of allowed filter sets sufficiently that it is easy to compute quality factors for them all and select the set that has the largest quality factor as optimum. For example, if $\tau_0$ has to be at least 1 μs and $\tau_3$ cannot exceed 32 μs and the four filters are related by powers of 2, then $\tau_0$ cannot exceed 4 μs and if $\tau_0$ peaking time intervals are 50 ns (associated with a 20 MHz ADC), then only 80 possible filter sets are allowed which is an easy number for a modern computer program to evaluate as a function of input count rate.

Figure 14:
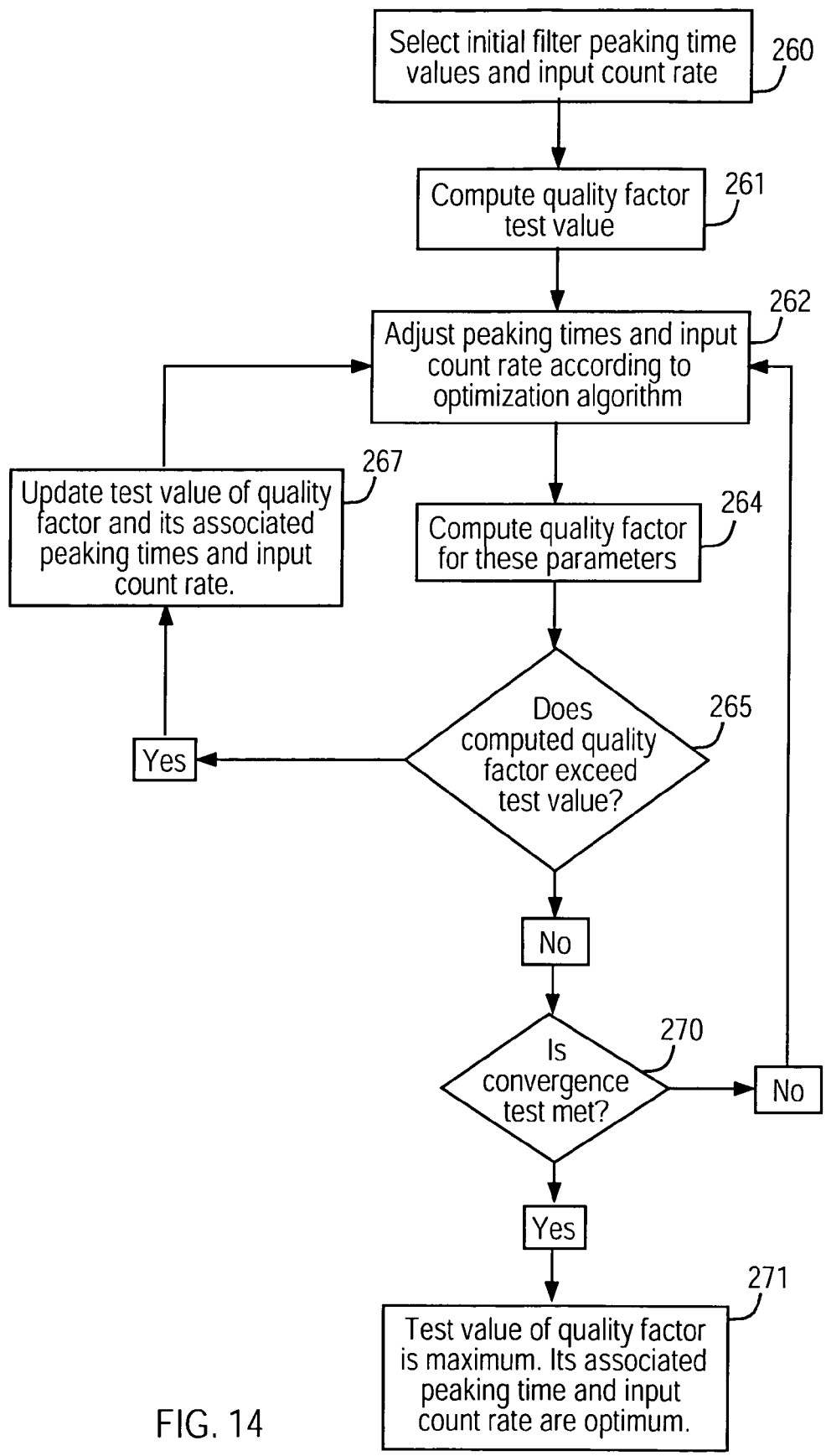
FIG. 14 shows a flowchart of a method for selecting an optimum set of filters by implementing a search algorithm based on maximizing the quality factor.

However, when there is no simple relationship between the filters' peaking times, then the number of possible sets rapidly becomes enormous. In the above case, there are 620 values at 50 ns intervals between 1 and 32 μs, which each of the filters might assume, subject only to the constraint that each be larger than the previous. Combined with 100 possible input count rates at 10,000 cps intervals between 10,000 and 1,000,000 cps, the total number of possibilities becomes too large to evaluate. The solution to this problem is to implement a search algorithm based on maximizing the quality factor. Function maximization is a well studied area and many algorithms and/or commercial programs are available that can treat this problem. The general approach is as shown in FIG. 14. First a set of initial filter peaking times and an input count rate (the "parameters") are selected 260 and then a quality factor is computed, using, for example, the methods of Sect. 2 (261) and set as the "test value". The values of these initial parameters are not critical to the method, though convergence will happen more rapidly if reasonable values based on experience are used. The optimization search then proceeds as follows. First 262 the parameters are adjusted according to the method of the particular optimization algorithm. We have successfully used methods varying from the crude (i.e., varying them randomly) to more efficient (if the last step increased the quality factor, repeat it) to sophisticated (conjugate gradient method). Second, the quality factor is then computed for this new parameter set 264 and then compared to the test value 265. Third, if it is larger, then an improvement has been obtained and 267 the test value is updated to equal this new quality factor, its parameter set is recorded, and step 262 is repeated. Fourth, if it is not larger, then we test for convergence 270. The convergence test applied will depend upon the optimization algorithm being used. For example, in the random adjustment approach, we asked if there had been 10,000 trials since the last improvement. If the process has not converged, then step 262 is repeated. Otherwise, a maximum quality factor has been found, 271 together with the peaking times and input count rate that produced it. In our crude optimizations, we carried out these steps in code we wrote ourselves. In more sophisticated searches we used, for example, the optimization routines found in the commercially available program MatLab. The important point here is that, once we have defined a quality factor as a quantity which gets larger as performance improves, then we can use any number of optimization methods to find the set of parameter values that produce the best performance under a particular set of measurement conditions. Clearly, defining a quality factor that got smaller as performance improved could be used the same way by employing optimization methods to find its minimum value. Therefore, although we normally only speak of maximizing the quality factor that increases as performance improves, defining one that decreases and then minimizing it is exactly the same concept and functionally equivalent.

5. Extensions of the Method

5.1 Weighted Sums

All of the designs we have presented have implemented variants of "trapezoidal" filtering, which is to say that they exclude a "gap" region in the vicinity of the pulse and apply equal weights to all data samples. More general applied filters can be built up out of a set of sub-filters represented (in the case of two sub-filters) by the form:

$$E = -\sum_{i=-L-G/2}^{-G/2} w_i v_i + \sum_{i=G/2}^{M+G/2} w_i v_i, \quad (28)$$

Where i equals 0 marks the pulse location, the asymmetry of the filter, if any, is contained in L not equal to M, and each measured value $v_i$ is scaled by a weight $w_i$. Variable length cusp filters of the type taught by Mott et al. [MOTT—1994] for example have this form. Similarly to our case 3.3, data are captured on both sides of each pulse and combined to measure its energy, the difference being that in the general case there is an additional step of applying weights to the data before the difference is taken. The important point, from the aspect of implementing our multi-spectral filtering method, is that if the set of weighting coefficients w that is applied to a captured data set is not a constant, then their values are chosen based upon L, the number of points in the data set. Hence, as before, the expected energy resolution is a function $R(L_1,L_2)$ of the lengths of the leading ($L_1$) and lagging ($L_2$) data sets and we can therefore index them by the values ($L_1, L_2$) and then sort them into a preselected set of spectra. Hence the methods taught in Sect. 3.1 and 3.3 are trivially extended to the respective cases of weighted filtering using a small number of fixed weighted filters (Sect 3.1) or completely time variant weighted filtering (Sect. 3.3). The inventive step, therefore, is to index filtered pulses according to the sub-filters used to process them and then use the index values to sort them into a set of spectra that preserve the applied filters' energy resolutions. This method is generic and does not depend upon the particular form of the applied filters.

5.2 Spectrometers Forming Linear Combinations of Captured Filter Values

Warburton and Momayezi [WARBURTON—2003A] taught that pulse height measurements can also be corrected for a variety of non-ideal effects, including ballistic deficit and higher order pole terms, by capturing a time correlated sequence of sub-filter outputs, where the sub-filters may be simple running sum filters or more complex filters of various forms, and forming a linear combination of them wherein the coefficients are computed based on the capture times of the sub-filter values and the non-ideal effects in the waveforms, to produce energy estimates that are insensitive to the non-ideal effects. For, example, three contiguous running sums can be combined to produce an energy value that is insensitive to ballistic deficit when used with an RC feedback preamplifier. The present inventive multi-spectral method could readily be applied to these cases as well. As a simple example, the implementation presented in Sect. 3.1 could simply be extended by also capturing a running sum over the region of the pulse that was there excluded between the leading and lagging sums and then combining the resultant three Running Sums according to the method of Warburton and Momayezi, where the linear coefficients would be selected based on the lengths of the leading and laggings Running Sums, said lengths also being used to index the result. As before, the energy resolutions of these filters would be uniquely defined by these index values and so the measured pulse heights could be binned into multiple spectra exactly as before.

5.3 Baseline Correction for Linear Combination Filter

Making baseline corrections in spectrometers of the class described in Sect. 4.2 is different, depending upon whether the preamplifier is of the reset type or RC feedback type.

In the reset preamplifier case, as discussed in Sections 3.2 and 3.4, detector leakage is converted into a output signal slope s and the methods those sections described for treating it may be easily extended to the case of Sect. 4.2 by applying appropriate linear coefficients to the baseline terms as well. Considering an example of a generalized applied filter comprised of a linear combination of sub-filters that are sums of weighted terms:

$$D = \kappa_1 \sum_{i=L_1}^{L_2} w_i v_i + \kappa_2 \sum_{i=M_1}^{M_2} w_i v_i + \kappa_3 \sum_{i=N_1}^{N_2} w_i v_i, \quad (29)$$

where the regions of summation may overlap. Describing a signal pulse with slope s as in Eqn. 26, the third sub-filter in Eqn. 29 becomes, as an example, $$WS_3 = \kappa_3 \sum_{i=N_1}^{N_2} w_i(C_0 + A + is) \quad (30)$$

$$= (C_0 + A)\kappa_3 \sum_{i=N_1}^{N_2} w_i + s\kappa_3 \sum_{i=N_1}^{N_2} iw_i,$$

which may be written as $$WS_3 = (C_0 + A)\kappa_3 W_{N_2,N_1} + s\kappa_3 V_{N_2,N_1} \quad (31)$$

where $$W_{N_2,N_1} = \sum_{i=N_1}^{N_2} w_i, \text{ and } V_{N_2,N_1} = \sum_{i=N_1}^{N_2} iw_i \quad (32)$$

Thus the baseline contribution is $s\kappa_3 V_{N_2,N_1}$, which is proportion both to the linear coefficient $\kappa_3$ and to $V_{N_2,N_1}$, which is the indicated sum of weighting coefficients over the running sum. This demonstrated the important point that baseline correction can be computed independently for each sub-filter. Further, because the baseline contribution is linear in $\kappa_3$, we can baseline correct the sub-filter output (i.e., subtract s $V_{N_2,N_1}$) before scaling by $\kappa_3$. This order of operations allows the number of multiplications to be cut in half.

Thus, the background contributions in all the sub-filter terms in Eqn. 29, or any linear combination, may be written as a constant ($V_{N_2,N_1}$) that depends only on the length of the filters (i.e., the index values $N_2$ and $N_1$) and the local signal slope s or its average <s> over several measurements. In practice, these terms can either be retrieved from a lookup table bases on the indices ($N_2$, $N_1$) or produced via a summation of the weights $w_i$ at the same time as the weighted sum of the data is being produced. In the case of simple running sum filters, or filters composed from running sums, such as triangular or trapezoidal filters, the two coefficients $W_{N_2,N_1}$ and $V_{N_2,N_1}$ assume the particularly simple forms $(N_2-N_1+1)$ and $(N_2-N_1+1)(N_2-N_1+2)/2$ computed in Sect. 3.4. This is germane because, since the indices in Eqn. 29 may overlap, this form also includes linear sums of triangular and trapezoidal filters as proposed by Warburton and Momayezi [WARBURTON—2003A].

In the RC feedback preamplifier case, the preamplifier converts a constant leakage current into a constant DC offset and, continuing the example of Eqn. 29, the baseline term in $WS_3$ becomes simply $\kappa_3$ $W_{N_2,N_1}$ DC. We observe that a property of the coefficients $\kappa$ will be that Eqn. 29 will produce the pulse's amplitude exactly when the preamplifier's DC offset is exactly zero, and will be zero when, in addition, there is no pulse present. Thus measurements of DC can be easily made by capturing a preselected applied filter combination at times when there is no pulse present, applying the coefficients specified by Eqn. 29, and then dividing the result by the sum of the $\kappa W$ products. As before, the W values $W_{N_2,N_1}$ can be found using a lookup table or computed by summation of the appropriate set of $w_i$ values. We note that in the particularly common case of simple trapezoidal filtering, where all $w_i$ values equal unity, $W_{N_2,N_1}$ just equals $(N_2-N_1+1)$ and the term $W_{N_2,N_1}$ DC can be computed either by multiplying DC by $(N_2-N_1+1)$ or by adding DC to itself $(N_2-N_1+1)$ times. The latter approach is easily accomplished using a circuit similar to blocks 240 and 243 in FIG. 13, where the Resettable Adder 240 is reset to zero, rather than to SG/2. Since the value of DC will typically be small, precision will be best maintained by left shifting DC some number N of bits, performing the adding operation (i.e., multiplying by $2^N$), and then right shifting the result by N bits (i.e., multiplying by $2^{-N}$) before subtracting from the sub-filter output and scaling by $\kappa_3$.

5.4. Application to Signals from Scintillation Sources

Scintillators stimulated by energetic particles or photons emit bursts of light, typically in the visible, whose time dependence can nominally be described by a sum of one or more decaying exponentials, although the onset of the pulse usually requires a finite time and the decay is often not smooth, but dominated by photon emission statistics. In this situation, the quantity that best reflects the energy of the stimulating particle or photon is not the amplitude of the pulse but rather its integrated area. Warburton and Momayezi [WARBURTON—2003A] have shown that these areas may be measured using essentially the same "weighted sums of running averages" techniques as referred to in Sect. 4.2. In this method, they found that the accuracy of the area determination depended upon the length of the running average filters used in the measurements. In particular, as the running sum lengths were reduced to values comparable to the exponential decay times, the ability to extrapolate the pulse's area from a limited sample degraded significantly. On the other hand, just as in the x-ray or gamma-ray processing cases, using longer filtering times produced better energy resolution but increased dead time and so reduced the maximum pulse rate that could be processed. Clearly then, the present multi-spectral method could be applied to this type of measurement, using a variety of running sum filter lengths and binning the results into different spectra depending upon what filter lengths were used to process a particular pulse.

In some cases, where the decaying light pulse is composed of two exponential terms, the identity of the exciting particle can be determined by comparing the areas of the two terms. [SKULSKI—2001]. In this approach, two consecutive running summation filters measure the decaying part of each light pulse, a shorter filter close to the start of the pulse to measure its short lifetime component and a longer filter to measure the longer lifetime component. In CsI(Tl), for example, the longer lifetime is 4 μs, so that, ideally, the length of the second filter should be 4-8 μs long. Using such a long filter length leads to excessive deadtime at higher counting rates, while shorter filters degrade the accuracy of the particle identification. In this situation as well, being able to adjust the length of the second filter on a pulse-by-pulse basis would allow both throughput and accuracy to be optimized.

5.5 Application to Signals from Other Sources

We invented this method in the context of processing pulses in the output signal coming from a preamplifier attached to x-ray, gamma-ray, or particle detector or the like to determine the energy of events in that detector. However, as Sect. 4.3 shows, what we are doing in the more general sense is determining some characteristic of "step-like" pulses, as described by Warburton et al. [WARBURTON—1997] that arrive randomly or semi-randomly in a noisy electronic signal and about which we can gather more or less information depending upon the length of the intervening signal between a specific pulse and its preceding and succeeding pulses. In the implementations of Sect. 3.1 and 3.3 we determine the pulse's amplitude, which is proportional to the energy of the detected event. In the case discussed in Sect. 4.3 we determine the pulse's area, which is again proportional to the energy of the detected event. The inventive step that we have demonstrated is to recognize that, by choosing filters, pulse-by-pulse, based on the amount of time we have between the pulse and its neighbors, we can increase the total amount of information that we can recover about some pulse characteristic (e.g., amplitude, area, decay time) by also sorting our results into different groups or categories, pulse-by-pulse, based upon indices derived from the applied filters' parameters. In the implementations presented here, the characteristic of interest was event energy and so we indexed the pulses based on the filter length parameters $L_1$ and $L2$ and then sorted them into different spectra whose energy resolutions were characterized by $L_1$ and $L_2$. However, as the discussion of Sect. 4.4 showed, other pulse characteristics such as decay time might also be of interest and results could be indexed based on other filter parameters. We further note that the sorting step need not be carried out immediately. For example, the captured filter outputs could be saved in list mode with their index values and sorted later, off line. This approach might be particularly useful in situations where the sorting procedure that maximized information recovery was not known at the time of data collection.

Adopting the terminology of linear systems theory, we observe that step-like pulses are the expected response of a single pole or multipole device to an impulsive stimulation and hence are an extremely common signal type. Characteristics of the pulses, including amplitude, area, partition of area between multiple decay terms, etc., therefore carry information about the stimulation, such as its amplitude (i.e., energy) and nature (i.e., particle type). All manner of mechanical, electrical, and chemical systems can be described in these terms. For example, superconducting, transition-edge bolometers produce step-like pulses as output signals in response to the absorption of photons of various energies, including the visible or neutrons. These pulses typically decay exponentially, with both their initial amplitude and integrated area being proportional to the energy of the excitation. Our method could therefore be applied to improve the energy resolution of this non-nuclear spectrometer and more generally to signal processing in any systems where this class of response appears.

6. References

The following are incorporated by reference:

AUDET - 1994: S.A. Audet, J.J. Friel, T.P. Gagliardi, R.B. Mott, J.I. Patel and C.G. Waidman, "High Resolution Energy Dispersive Spectroscopy with High Purity Germanium Detectors and Digital Pulse Processing", in Nuclear Science Symposium & Medical Imaging Conference 1994, 1994 IEEE Conference Record, Vol. 1, 30 Oct. - 5 Nov. 1994, pp. 155-159; and references therein.
KNOLL - 1989: "Radiation Detection and Measurement, $2^{nd}$ Ed." by Glenn F. Knoll (J. Wiley, New York, 1989). See the specific pages cited.
KOEMAN - 1975: H. Koeman, "Principle of operation and properties of a transversal digital filter" in Nuclear Instruments and Methods 123 (1975) 169-180. See also: U.S. Pat. No. 3,872,287, issued March 18, 1975 to H. Koeman for "Method of, and apparatus for, determining radiation energy distributions.
LAKATOS - 1990: T. Lakatos, "Adaptive Digital Signal Processing for X-ray Spectrometry" in Nuclear Instruments and Methods in Physics Research B47 (1990) 307-310.
MOTT - 1994: U.S. Pat. No. 5,349,193, issued Sep. 20, 1994 to R.B. Mott, C.G. Waldman and D.E. Ungar for "Highly sensitive nuclear spectrometer apparatus and method".
SKULSKI - 2001: W. Skulski & M. Momayezi, "Particle identification in CsI(Tl) using digital pulse shape analysis", Nuclear Instruments and Methods in Physics Research A458 (2001) 759-771. See also, XTA Product Application Note: "Particle Identification by Real Time Pulse Shape Analysis in CsI(Tl), Phoswiches, and other Scintillators", (January 2003).
WARBIJRTON - 1997: U.S. Pat. No. 5,684,850, issued Nov. 4, 1997 to W.K. Warburton and B. Hubbard for "Method and apparatus for digitally based high speed x-ray spectrometer".
WARBURTON - 1999A: U.S. Pat. No. 5,870,051, issued Feb. 9, 1999 to W.K. Warburton and B Hubbard for "Method and apparatus for Analog Signal Conditioning for High Speed, Digital X-ray Spectrometer".
WARBURTON - 1999B: U.S. Pat. No. 5,873,054, issued Feb. 16, 1999 to W.K. Warburton and Z. Zhou for "Method and apparatus for combinatorial logic signal processor in a digitally based high speed x-ray spectrometer".
WARBURTON - 2003A: U.S. Pat. No. 6,587,814, issued Jul. 1, 2003 to W.K. Warburton and Michael Momayezi for "Method and apparatus for improving resolution in spectrometers processing output steps from non-ideal signal sources".
WARBURTON - 2003B: U.S. Pat. No. 6,609,075, issued Aug. 19, 2003 to W.K. Warburton, Jackson T. Harris and Peter M. Grudberg for "Method and apparatus for baseline correction in x-ray and nuclear spectroscopy systems 7. Conclusion In the foregoing description of specific embodiments we have shown examples of a general technique for measuring the amplitudes of pulses in the output of a preamplifier wherein we supply a spectrometer that is capable of applying a plurality of filters to the measurement process, select the specific filter used to measure a particular pulse based on measured time intervals between said pulse and its predecessor and successor, and then indexing the measurement result and placing it into one member of a set of spectra, where that member is determined by the index, which is based on parameters describing the selected filter, such as its energy resolution or filtering times. The three examples shown included a simple case that used a small number of fixed length energy filters, an intermediate case that assembled energy filters on a pulse by pulse basis from a small number of fixed length running average filters, and a fully time variant case that adjusted the lengths of the running average filters making up the energy filter on a pulse by pulse basis. We also showed how it was possible to make baseline corrections in these spectrometers even in the fully time variant case.

As we made clear in the presentation, while these embodiments are functional and effective, they were primarily presented for purposes of illustration and description. Because the taught principle is a general one, the presentation was not intended to be exhaustive or to limit the invention to the precise forms described, and obviously, many modifications and variations are possible in light of the above teaching. Thus, these embodiments were chosen and described in order to best explain the principles of the invention and its practical application to thereby enable others in the art to best utilize the invention in various embodiments and with such modifications as best suit the invention to the particular uses contemplated.

Other forms, modifications, alternative constructions and equivalents can be used and the method can be applied to measurements in other areas than those described. As a first example, while our preferred implementations are purely digital, the same method can be implemented using purely analog, primarily analog, or mixed analog-digital circuit techniques. As a second example, the method can be applied to cases where time variant weighted filters are employed or where linear combinations of captured filter values are combined to create energy filters that are insensitive to various sorts of non-ideal preamplifier behavior. Third, there are clearly many means for indexing and processing captured filter outputs to build multiple spectra, since all that is required is the means to carry out simple arithmetic operations and memory in which to store results. In one implementation we accomplished this using a DSP with internal memory; in another we used an FPGA with multiplying capability coupled to an external memory. Other possibilities range from using hardwired logic for the computation to storing indexed Filter Values (e.g., {Filter Value, $L_1$, $L_2$} triplets) in list mode and then processing them later, offline, using a general purpose computer. Fourth, while the summation periods of the running sums in FIG. 7A were implemented as powers of two of each other, this is not necessary and slightly improved quality factors can be obtained by using slightly different ratios. Fifth, while in our preferred implementations we have assigned each filter output to only a single spectrum, this is not a requirement of the method and there may be cases where it is advantageous to create different sets of spectra with different sorting criteria, and each output sorted into all the spectra whose criteria it matched. Finally, while the method was derived in the context of processing step-like pulses in the output of a preamplifier attached to an x-ray or gamma-ray detector to determine their energies, the same method can be applied more generally measuring other characteristics of step-like pulses arriving randomly in noisy electronic signals, including, but not limited to, pulse amplitudes, areas and decay times.

Therefore, the above description should not be taken as limiting the scope of the invention, as defined by the appended claims.

What is claimed is:

1. A method for analyzing an electronic signal containing randomly spaced step-like pulses to obtain estimates of a characteristic of at least some of the pulses, the method comprising:
   detecting the presence of at least some of the randomly spaced pulses in the signal, and for at least some detected pulses:
   measuring the time intervals between the detected pulse and its immediately preceding and succeeding detected pulses;
   capturing, for at least some detected pulses, the output of a filter applied to the pulse to obtain the estimate, wherein the applied filter is selected from a plurality of available filters based upon the specific values of these measured time intervals;
   recording the estimate; and
   recording with the estimate one or more indices that encode the identity of the selected filter;
   wherein one or more circuits or processors are used to perform at least one of the steps of detecting, measuring, capturing, recording the estimate, and recording the one or more indices.

2. The method of claim 1 wherein the filters in the plurality of available filters are described by one or more parameters and the one or more indices identifying the selected filter are derived from these one or more parameters.

3. The method of claim 1 wherein the estimates, so recorded, are sorted into a plurality of categories, each estimate being assigned to a particular category or categories based upon the values of that estimate's indices.

4. The method of claim 1 wherein the captured value is "baseline" corrected by subtracting a baseline value representing that fraction of the estimate obtained from the filter that would be present if the filter were applied to the same portion of the signal but without the step-like pulse being present.

5. The method of claim 1 wherein the electronic signal is the output of a preamplifier attached to one of:
   a photon or particle detector, in which case one pulse characteristic is the pulse amplitude, which is proportional to the energy of the event within the detector that generated the pulse;
   a scintillation detector, in which case one pulse characteristic is the pulse area, which is proportional to the energy of the event within the detector that generated the pulse and one or more additional pulse characteristics are the exponential decay times of the pulse; and
   a superconducting bolometer, in which case the pulse characteristic is either the pulse amplitude or pulse area, both of which are proportional to the energy of the event within the detector that generated the pulse.

6. The method of claim 1 wherein the characteristic is one of: the pulse's amplitude, the pulse's area, and the pulse's one or more decay times.

7. The method of claim 1 wherein at least one of the plurality of available filters comprises two or more sub-filters, wherein:
   at least a first sub-filter is selected from a first set of available sub-filters based upon the length of the preceding time interval between the pulse and its immediately preceding detected pulse;
   at least a second sub-filter is selected from a second set of available sub-filters based upon the length of the succeeding time interval between the pulse and its immediately succeeding detected pulse wherein the second set may be the same as the first set or different from the first set; and
   the output of the filter is obtained by forming a linear combination of the outputs of the sub-filters.

8. The method of claim 1 wherein:
   there are N filters in the plurality of available filters;
   these filters are characterized by their peaking times $\tau_i$, with i ranging from 0 to N−1; and
   the selected filter is the filter in the plurality whose peaking time $\tau_j$ has the largest value that is still smaller than the lesser of the measured time intervals between the detected pulse and its immediately preceding and succeeding detected pulses.

9. The method of claim 1 wherein a quality factor is defined for the plurality of available filters and used to select the individual filters that comprise the plurality.

10. The method of claim 1, and further comprising:
    initializing a plurality of spectra based on filters that are available to be applied to detected pulses; and for each estimate, incorporating that estimate into the spectrum that corresponds to the selected one or more filters from which the estimate was obtained.

11. The method of claim 1 wherein:

more than one of the plurality of filters are applied to the detected pulse; and only the output of the selected filter is captured and recorded.

12. The method of claim 1 wherein:

the filter is selected before the filter is applied; and the selected filter is the only filter applied to that pulse.

13. The method of claim 1 wherein, to obtain estimates of multiple characteristics of the pulses, outputs are captured from multiple selected filters.

14. The method of claim 1 wherein:

the plurality of available filters includes a plurality of filters that independently analyze the signal and produce outputs that are estimates of the characteristic; and the filter is selected by selecting which output to record.

15. The method of claim 1 wherein the plurality of available filters is provided by a single filter comprising one or more component filters, each of whose filtering lengths can be adjusted over a pre-determined set of values and whose outputs are combined to provide the filter's output.

16. The method of claim 4 wherein:

the members of the plurality of available filters are described by one or more parameters; and the baseline value is estimated by measuring the baseline value of an additional filter, referred to as the baseline filter, at one or more times when no step-like pulse is present, and scaling this baseline value to account for any differences between the baseline filter and the filter from which the estimate is captured.

17. The method of claim 7 wherein:

the available sub-filters are characterized by their filtering times;

the selected first sub-filter is the member of the set of available sub-filters from which it is drawn having the longest filtering time that will fit into the preceding time interval; and the selected second sub-filter is the member of the set of available sub-filters from which it is drawn having the longest filtering time that will fit into the succeeding time interval.

18. The method of claim 7 wherein the length of the first sub-filter is $L_1$ and the length of the second sub-filter is $L_2$, and the output of the applied filter is binned into one member r of a set of R spectra, the member being selected by:

successively using $L_1$ and $L_2$ as addresses in a first lookup table to obtain a pair of secondary indices $J_1$ and $J_2$; and computing $RJ_2+J_1$ as an address in a second lookup table to obtain the index r identifying the spectrum into which the applied filter's output is to be binned.

19. The method of claim 7 wherein the baseline correction is computed for the applied filter by first computing a baseline correction term for each of the two or more sub-filters that make up the applied filter and then combining these correction terms using the same linear coefficients that are applied to the sub-filters to form the applied filter.

20. The method of claim 7 wherein the sub-filters are digital filters of the form $$\sum_{i=N_1}^{N_2} w_i v_i \qquad (33)$$

where $v_i$ are digitized preamplifier signal values, $w_i$ are applied weights; and the numbers $N_1$ to $N_2$ define the summation region of the sub-filter.

21. The method of claim 7 wherein the set of available sub-filters is a plurality of N fixed length filters that are all powers of two of the length of the shortest member in the set.

22. The method of claim 9 wherein the quality factor is a measure of the statistical accuracy that can be achieved in determining the size of a small peak on a large background within a fixed measurement time.

23. The method of claim 9 wherein the quality factor is modeled, based on the characteristics of the detector, the time constants of the filters, the input count rate, and the characteristics of the spectral features to be detected, and an optimum plurality of filters is selected by seeking a plurality of filter time constants and an input count rate that produces an extremum in the value of the quality factor.

24. The method of claim 14 wherein each filter has only a single filtering length and the selected filter is the one with the largest filter length that is less than both measured time intervals.

25. The method of claim 15 wherein the selection is made by comparing the measured time intervals to the filtering lengths of the one or more components.

26. The method of claim 15 wherein said single filter has only a single component filter and said capturing step comprises:

capturing a first output from the component filter, based on the time interval between the detected pulse and its immediately preceding detected pulse;

capturing a second output from the component filter, based on the time interval between the detected pulse and its immediately succeeding detected pulse; and forming a linear combination of two captured outputs.

27. The method of claim 1 wherein:

the plurality of available filters is provided by providing a plurality of component filters that independently analyze the signal and providing means to capture a first output from a first member of the plurality based on the measured time interval between the detected pulse and its immediately preceding detected pulse;

capture a second output from a second member of the plurality based on the measured time interval between the detected pulse and its immediately succeeding detected pulse; and combine the two outputs as the output of the filter; where said first and second members may be the same or different filters, depending upon the values of the two measured time intervals.

28. The method of claim 1 wherein:

the available filters are characterized by a first, leading, filtering length and a second, trailing, filtering length; and the bases on which the applied filter is selected from the plurality of available filters are:

first, that its first filtering length does not exceed the measured time interval to the preceding pulse;

second, that its second filtering length does not exceed the measured time interval to the succeeding pulse; and third, that it provides the best resolution value of the characteristic among the available filters that satisfy the first two conditions.

29. The method of claim 20 wherein, designating the lengths of the first and second sub-filters $L_1$ and $L_2$, respectively, the filter outputs are sorted into (N+1) N/2 spectra, where each spectrum is assigned to a unique pair of values $(L_1, L_2)$, irrespective of their order.

30. The method of claim 21 wherein:

the lengths of the N sub-filters in the set are represented as:

$$L_k = 2^k L_0, \tag{34}$$

where:

$L_0$ is the length of the shortest member of the set;

k takes on values between 0 and N−1;

the values of the exponent k describing the lengths of the leading first and lagging second sub-filters are i and j, respectively; and the output D of the applied filter is formed from the outputs $S_{iLead}$ and $S_{jLag}$ of the first, second sub-filters, respectively, as $$D = 2^{N-1-j} S_{jLag} - 2^{N-1-i} S_{iLead} \tag{35}.$$

31. The method of claim 22 wherein the quality factor is inverse of the time required to detect a peak above its background at a specified signal to noise ratio.

32. The method of claim 22 wherein the quality factor is the sum of the quality factors of the individual filters that comprise the plurality.

33. The method of claim 23 wherein the time constants of the plurality of filters are related by a mathematical formula and are allowed to have a discrete plurality of values bounded by minimum and maximum values and the optimum plurality of filters is found by the steps of:

first, setting the shortest filter to the minimum allowed value and computing the other filter values in the plurality by the mathematical formula;

second, using the quality factor model to compute the plurality of filters' quality factor for an allowed set of input counting rates and select the rate that produces an extremum in the quality factor;

third, repeating the first and second steps, each time increasing the shortest filter time to the next smallest allowed value until the longest filter time reaches the maximum allowed value; and fourth, selecting the largest of the extreme quality factor values so produced and using its associated plurality of filter time constants to define the optimum plurality of filters.

34. The method of claim 23 wherein the time constants of the filters are allowed to have a discrete plurality of values bounded by minimum and maximum values but are not related by a mathematical formula and the optimum plurality of filters is found by the steps of:

first, specifying an initial plurality of filter time constants and an input counting rate;

second, using the quality factor model to compute the plurality of filters' quality factor and record it as a test value;

third, applying an algorithm that seeks an extremum in the quality factor by adjusting one or more of the set of parameters comprising the filters' time constants and the input counting rate, computing, using the quality factor model, the plurality of filters' quality factor for this set of parameter values and comparing it to the test value, and iterating until a convergence test is met; and fourth, using the set of filter time constants associated with the quality factor extremum so found to define the optimum plurality of filters.

35. The method of claim 30 wherein D is baseline corrected by:

making consecutive measurements $S_{\beta Lead}$ and $S_{\beta Lag}$ of the k=β sub-filter $L_\beta$ in at least some of the intervals between successive pulses that are long enough to permit it;

forming the baseline correction term $D_b$ given by:

$$D_b = 2^{N-1-\beta}(S_{\beta Lag} - S_{\beta Lead}); \text{ and} \tag{36}$$

then subtracting from measured values of D the expression:

$$D_{BKG} = D_b\left(2^{j-\beta-1} + 2^{i-\beta-1} + 2^{-\beta}\frac{G}{L_0}\right), \tag{37}$$

where G is the length of the gap between the two sub-filters.

36. The method of claim 26 wherein:

the component filter has an allowed set of filter lengths;

the first output is captured using the largest allowed filter length that is less than the measured time interval between the detected pulse and its immediately preceding detected pulse; and the second output is captured using the largest allowed filter length that is less than the measured time interval between the detected pulse and its immediately succeeding detected pulse.

37. A method for analyzing an electronic signal containing randomly spaced step-like pulses to obtain an estimate of a characteristic of at least some of the pulses, the method comprising:

providing a plurality of filters, each of which, in response to a pulse in the signal, can produce an output representing an estimate of the characteristic of the pulse and each of which is characterized by a different respective resolution value of the characteristic;

detecting the presence of at least some of the randomly spaced pulses in the signal, and for at least some detected pulses:

measuring the time intervals between the detected pulse and its immediately preceding and succeeding detected pulses;

selecting the filter that allows the maximum resolution for that pulse without that pulse becoming piled up with that detected pulse's immediately preceding and succeeding detected pulses;

for at least some detected pulses, capturing the output that the selected filter produces to provide said estimate;

recording the estimate; and recording with the estimate one or more indices that uniquely associate the estimate with the selected filter;

wherein one or more circuits or processors are used to perform at least one of the steps of detecting, measuring, selecting, capturing, recording the estimate, and recording the one or more indices.

38. The method of claim 37, and further comprising:

initializing a plurality of spectra corresponding to the plurality of filters; and for each estimate, incorporating that estimate into the selected filter's corresponding spectrum.

39. The method of claim 37 wherein:
the filter is selected after the filter is applied; and
only the output of the selected filter is captured and recorded.

40. The method of claim 37 wherein:
the filter is selected before the filter is applied; and
the selected filter is the only filter applied to that pulse.

41. An apparatus for analyzing an electronic signal containing randomly spaced step-like pulses to obtain estimates of a characteristic of at least some of the pulses, the apparatus comprising:
means for detecting the presence of at least some of said randomly spaced pulses in the signal;
means for measuring the time intervals between the detected pulse and its immediately preceding and succeeding detected pulses;
means for providing a plurality of filters capable of filtering said step-like pulses to provide outputs representing estimates of said characteristic;
means for capturing, for at least some detected pulses, the output of a filter applied to the pulse to obtain the estimate, wherein the applied filter is selected from said plurality of available filters based upon the specific values of these measured time intervals; and
means for recording the estimate; and
means for recording with the estimate one or more indices that encode the identity of the selected filter.

42. The apparatus of claim 41 and further comprising means for sorting the estimates, so recorded, into a plurality of categories, each output being assigned to a particular category based upon the values of that output's one or more indices.

43. The apparatus of claim 41 and further comprising means for baseline correcting the output of a selected filter by subtracting a baseline value representing that fraction of the output of said selected filter that would be present if the selected filter were applied to the same portion of the signal but without the step-like pulse being present.

44. The apparatus of claim 41 wherein:
the means for providing a plurality of filters comprises a plurality of discrete filters; and
the means for capturing captures only the output from the selected filter.

45. The apparatus of claim 41 wherein:
the means for providing a plurality of filters comprises a single filter having one or more component filters, each of whose filtering lengths can be adjusted over a predetermined set of values and whose outputs are combined to provide the filter's output.

46. The apparatus of claim 42 wherein said categories are spectra.

* * * * *